(12) United States Patent
Chen et al.

(10) Patent No.: US 8,912,599 B2
(45) Date of Patent: Dec. 16, 2014

(54) SEMICONDUCTOR DEVICE AND METHOD OF FABRICATING THE SAME

(71) Applicant: Nuvoton Technology Corporation, Hsinchu (TW)

(72) Inventors: Po-An Chen, Hsinchu (TW); Gene Sheu, Hsinchu (TW); Shao-Ming Yang, Hsinchu (TW); MD Imran Siddiqui, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/048,053

(22) Filed: Oct. 8, 2013

(65) Prior Publication Data

US 2014/0061788 A1 Mar. 6, 2014

Related U.S. Application Data

(63) Continuation-in-part of application No. 13/688,231, filed on Nov. 29, 2012, now Pat. No. 8,592,901.

(30) Foreign Application Priority Data

Aug. 31, 2012 (TW) .............................. 101131784 A
Aug. 19, 2013 (TW) .............................. 102129670 A

(51) Int. Cl.
| H01L 29/66 | (2006.01) |
| H01L 29/78 | (2006.01) |
| H01L 29/06 | (2006.01) |
| H01L 29/08 | (2006.01) |
| H01L 29/423 | (2006.01) |
| H01L 29/10 | (2006.01) |

(52) U.S. Cl.
CPC ...... *H01L 29/7816* (2013.01); *H01L 29/66659* (2013.01); *H01L 29/66681* (2013.01); *H01L 29/0634* (2013.01); *H01L 29/0878* (2013.01); H01L 29/42368 (2013.01); H01L 29/0696 (2013.01); H01L 29/086 (2013.01); H01L 29/1087 (2013.01)
USPC .......................................... 257/339; 438/286

(58) Field of Classification Search
CPC ..................... H01L 29/7816; H01L 29/66659; H01L 29/66681; H01L 29/0878; H01L 29/0634
USPC ........................................... 257/339; 438/286
See application file for complete search history.

(56) References Cited

U.S. PATENT DOCUMENTS 6,773,997 B2 8/2004 Imam et al.
6,909,143 B2 6/2005 Jeon et al.
(Continued)

FOREIGN PATENT DOCUMENTS

TW 506132 10/2002

OTHER PUBLICATIONS

Manjunatha et al., "Ron Improvement with Duplex Conduction Channel in UHV Device," IEEE 7th InternationalPower Engineering and Optimization Conference (PEOCO), Jun. 3-4, 2013, pp. 83-86.
(Continued)

*Primary Examiner* — Trung Q Dang
(74) *Attorney, Agent, or Firm* — Jianq Chuyn IP Office

(57) ABSTRACT

A semiconductor device is provided. The semiconductor device includes a drain region, a source region, a channel region and a hybrid doped region. The drain region of a first conductivity type is located in a substrate. The source region of the first conductivity type is located in the substrate and surrounding the drain region. The channel region is located in the substrate between the source region and the drain region. The hybrid doped region includes a top doped region and a compensation doped region. The top doped region is of a second conductivity type, having a doping concentration decreased from a region near the channel region to a region near the drain region, and located in the substrate between the channel region and the drain region. The compensation doped region of the first conductivity type is located in the top doped region to compensate the top doped region.

20 Claims, 17 Drawing Sheets

(56) References Cited

U.S. PATENT DOCUMENTS

| | | |
|---|---|---|
| 7,221,011 B2 | 5/2007 | Banerjee et al. |
| 7,851,857 B2 | 12/2010 | Fu et al. |
| 8,154,078 B2 | 4/2012 | Chang et al. |
| 8,252,652 B2 | 8/2012 | Chang et al. |
| 2012/0043608 A1* | 2/2012 | Yang et al. .................... 257/336 |
| 2014/0070315 A1* | 3/2014 | Levy et al. .................... 257/343 |

OTHER PUBLICATIONS

Vasantha et al., "Effects of Antimony and Arsenic Ion Implantation on High Performance of Ultra High Voltage Device," IEEE International Conference on Electron Devices and Solid-State Circuits (EDSSC'13), Jun. 3-5, 2013, pp. 1-2.

"Office Action of Taiwan Counterpart Application", issued on Jul. 8, 2014, p. 1-p. 5.

* cited by examiner

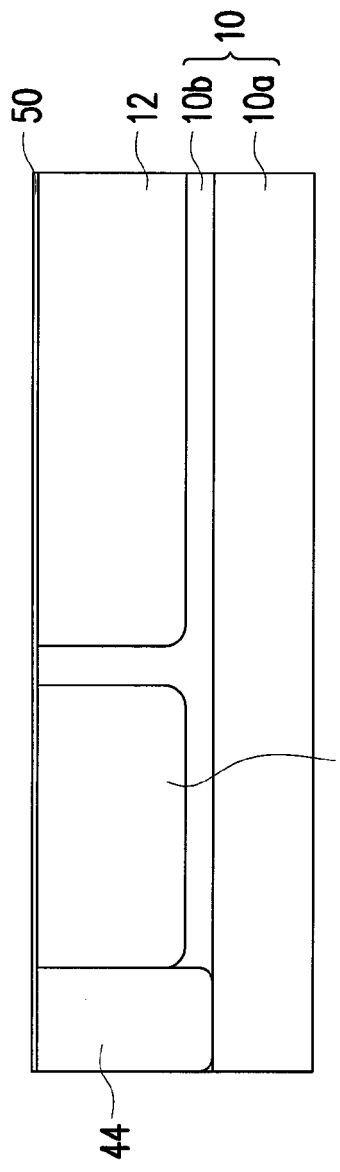
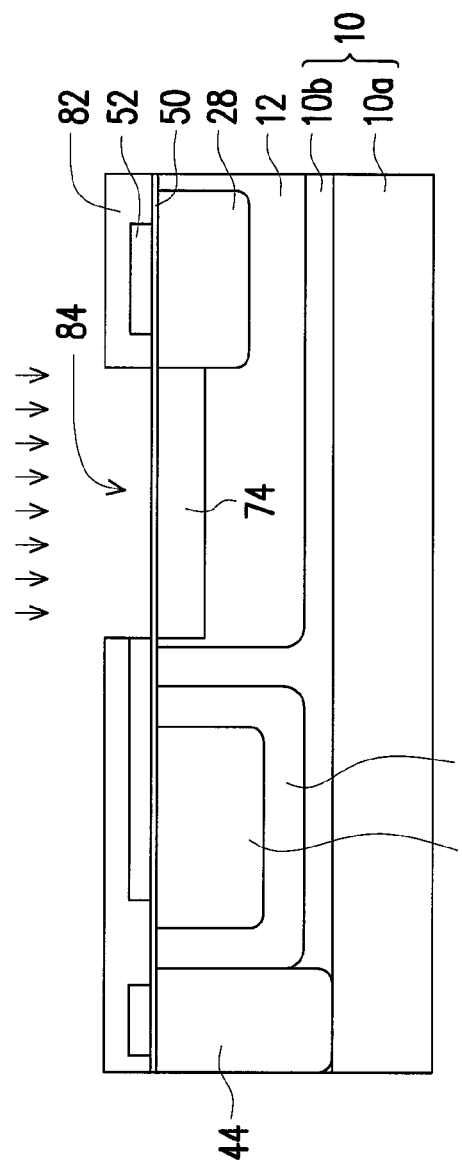

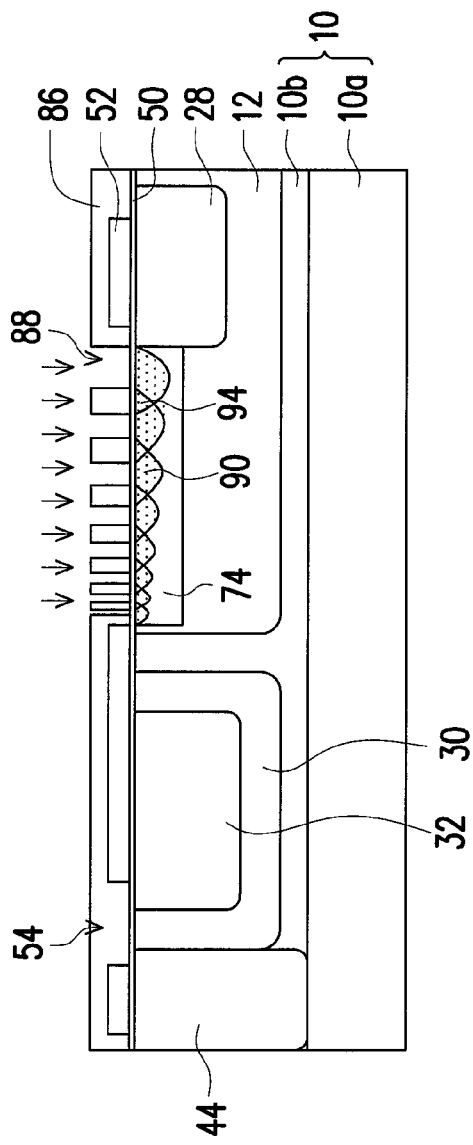
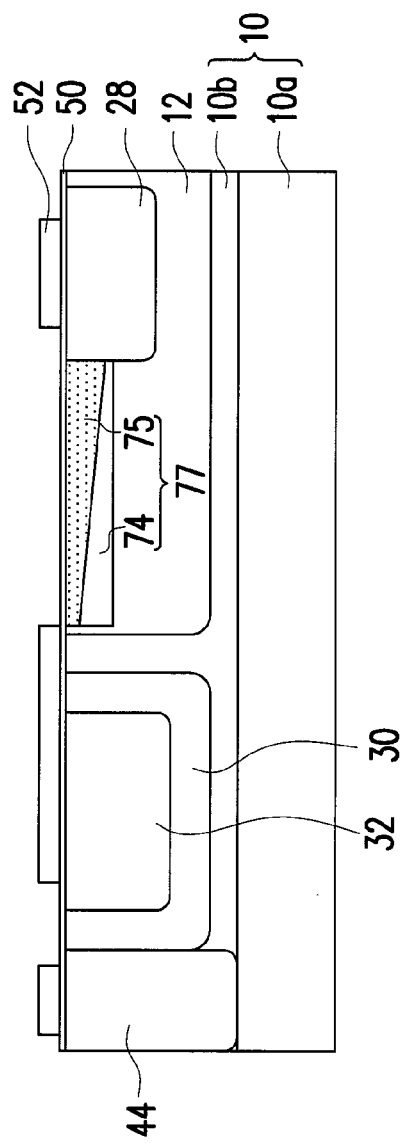
FIG. 6C
FIG. 6D

SEMICONDUCTOR DEVICE AND METHOD OF FABRICATING THE SAME

CROSS-REFERENCE TO RELATED APPLICATION

This application is a continuation-in-part application of and claims the priority benefit of U.S. application Ser. No. 13/688,231, filed on Nov. 29, 2012, now allowed, which claims the priority benefit of Taiwan application serial no. 101131784, filed on Aug. 31, 2012. This continuation-in-part application also claims the priority benefit of Taiwan application serial no. 102129670, filed on Aug. 19, 2013. The entirety of each of the above-mentioned patent applications is hereby incorporated by reference herein and made a part of this specification.

BACKGROUND OF THE INVENTION

1. Field of the Invention

The invention relates to a semiconductor device and a method of fabricating the same.

2. Description of Related Art

A high breakdown voltage and a low on-state resistance must be provided to reduce power loss when operating an ultra high voltage device. Currently, array structures are developed to provide higher current while maintaining sufficient breakdown voltage. In layouts of AC-DC products, layout areas can be reduced and the performance of devices can be enhanced through the array structures.

SUMMARY OF THE INVENTION

Embodiments of the invention are directed to a semiconductor device and a method of fabricating a semiconductor device, which can reduce on-state resistance and increase breakdown voltage.

Embodiments of the invention propose a semiconductor device which includes a drain region, a source region, a channel region, a gate and a hybrid doped region. The drain region of a first conductivity type is located in a substrate. The source region of the first conductivity type is located in the substrate. The channel region is located in a portion of the substrate between the source region and the drain region. The gate covers the channel region and the portion of the substrate. The hybrid doped region is located in the substrate between the channel region and the drain region. The hybrid doped region includes a top doped region and a compensation doped region. The top doped region of the second conductivity type is located in the substrate between the channel region and the drain region, and the top doped region has a doping concentration gradually decreased from a region near the channel region to a region near the drain region. The compensation doped region of the first conductivity type is located in the top doped region to compensate the top doped region.

Embodiments of the invention further propose a method of fabricating a semiconductor device which includes: forming a top doped region of a second conductivity type; forming a compensation doped region of a first conductivity type, and the compensation doped region being located in the top doped region; forming a drain region on a first side of the top doped region, and the drain region being of a first conductivity type; forming a source region on a second side of the top doped region, the source region being of the first conductivity type, and including a channel region in a portion of a substrate between the source region and the drain region, and a doping concentration of the top doped region is gradually decreased from a region near the channel region to a region near the drain region.

Embodiment of the invention further propose a metal oxide semiconductor field effect transistor which includes a drain region, a source region, a gate, a gate dielectric layer, a compensation doped region and a top doped region. The drain region of a first conductivity type is located in a substrate. The source region of the first conductivity type is located in the substrate and surrounding the drain region. The gate is located over the substrate between the source region and the drain region. The gate dielectric layer is located between the gate and the substrate. The compensation doped region of the first conductivity type is located in the substrate between the source region and the drain region. The top doped region of a second conductivity type is located below the compensation doped region, and having a doping concentration gradient in which a concentration is gradually decreased from a region near the source region to a region near the drain region.

Embodiments of the invention further propose a method of fabricating a semiconductor device which includes: forming an N-type doped layer in a substrate; forming a top doped region of a P-type in the N-type doped layer between a region predetermined for forming a drain region and a region predetermined for forming a channel region; implanting an N-type dopant in the top doped region to form a compensation doped region in the top doped region; forming the drain region of an N-type in the N-type doped layer; and forming a source region of the N-type conductivity type on a side of the channel region.

To make the above features and advantages of the disclosure more comprehensible, several embodiments accompanied with drawings are described in detail as follows.

BRIEF DESCRIPTION OF THE DRAWINGS

FIGS. 6A through 6E are cross-sectional views of a fabricating process of the metal oxide semiconductor field effect transistor depicted in FIG. 4A along line II-II.

DESCRIPTION OF THE EMBODIMENTS

Figure 1A:
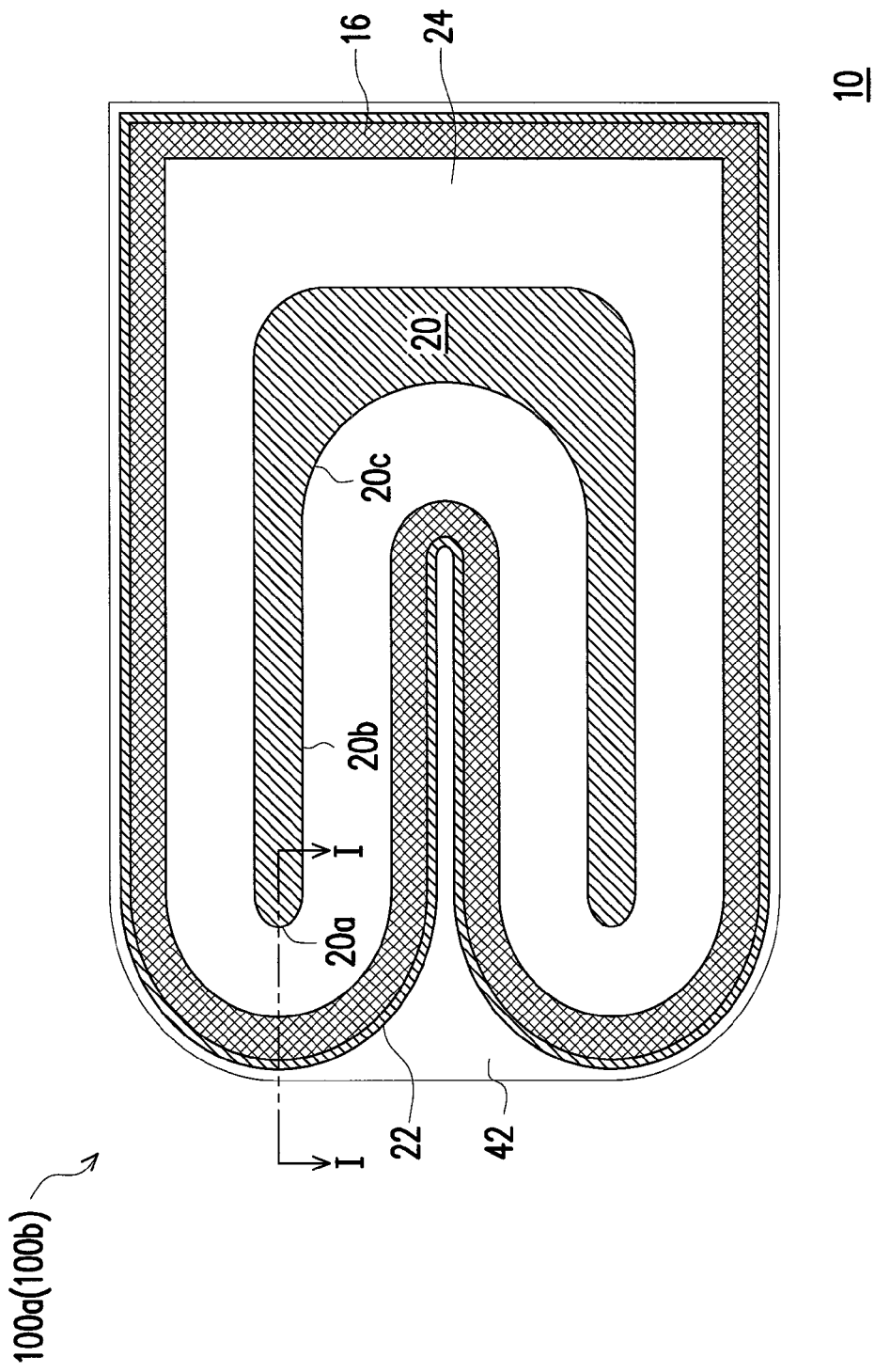
FIG. 1A is a top view illustrating a metal oxide semiconductor field effect transistor according to a first embodiment of the invention.
Figure 1B:
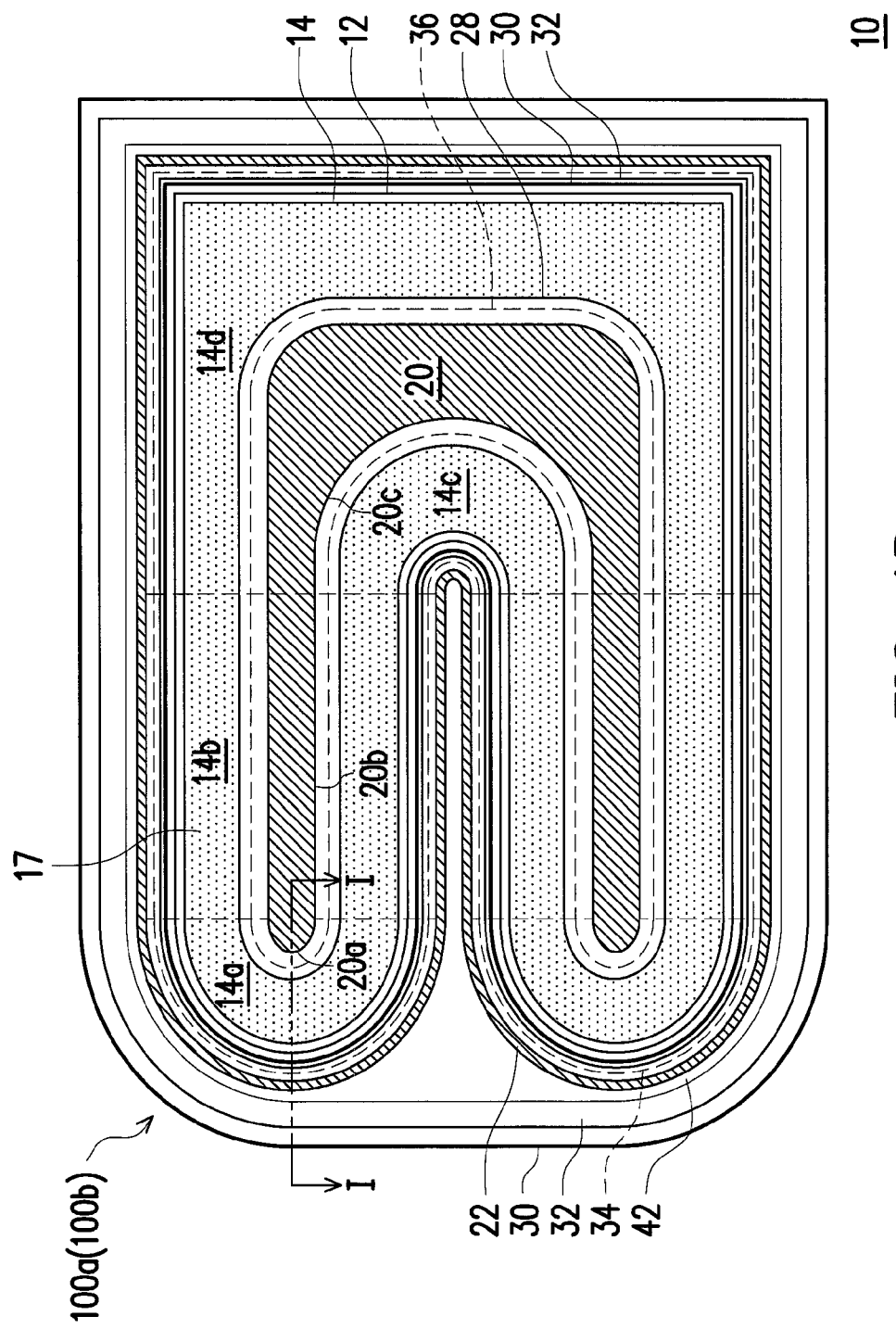
FIG. 1B is a partial top view illustrating the metal oxide semiconductor field effect transistor according to the first embodiment of the invention, in which a gate and an isolation structure are not illustrated.
Figure 1C:
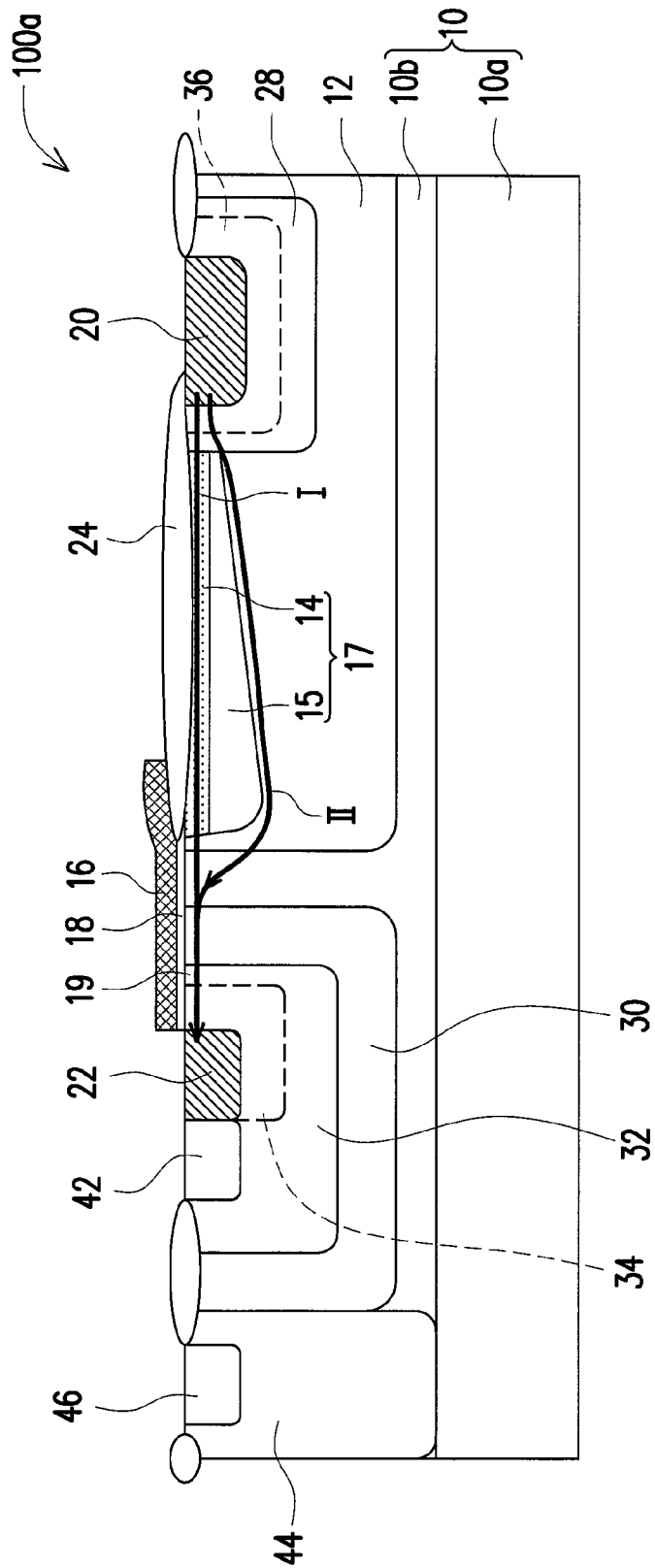
FIG. 1C is a cross-sectional view of the metal oxide semiconductor field effect transistor depicted in FIG. 1A along line I-I according to an exemplary embodiment.

FIG. 1A is a top view illustrating a metal oxide semiconductor field effect transistor according to a first embodiment of the invention. FIG. 1B is a partial top view illustrating the metal oxide semiconductor field effect transistor according to the first embodiment of the invention, in which a gate and an isolation structure are not illustrated. FIG. 1C is a cross-sectional view of the metal oxide semiconductor field effect transistor depicted in FIG. 1A along line I-I according to an exemplary embodiment.

In the following embodiments, a first conductivity type can be a P-type or an N-type, and a second conductivity type is opposite to the first conductivity type which can be an N-type or a P-type. The present embodiments can be implemented by having the first conductivity type being the N-type and the second conductivity type being the P-type as an example, but the invention is not limited thereto.

Referring to FIG. 1A, FIG. 1B and FIG. 1C, a metal oxide semiconductor field effect transistor 100a according to an embodiment of the invention includes a gate 16, a gate dielectric layer 18, a source region 22, a drain region 20 and a hybrid doped region 17. According to another embodiment, the metal oxide semiconductor field effect transistor 100a can further include a first doped region 12, a second doped region 30, a third doped region 32, a fourth doped region 28 and heavily doped regions 34 and 36.

The substrate 10 can be a semiconductor substrate such as a silicon substrate. The substrate 10 can include a P-type dopant or a N-type dopant. The P-type dopant can be an ion of group IIIA such as a boron ion. The N-type dopant can be an ion of group VA such as an arsenic ion or a phosphorous ion. According to another embodiment of the invention, the substrate 10 can also include a semiconductor substrate 10a and an epitaxial layer 10b located thereon. In the present embodiment, the semiconductor substrate 10a can be a P-type substrate, while the epitaxial layer 10b can be an N-type layer (N-epi).

The first doped region 12 (e.g., a first N-type well region) of the first conductivity type is located in the substrate 10. The hybrid doped region 17, the fourth doped region 28, the heavily doped region 36 and the drain region 20 can be located in the first doped region 12. The fourth doped region 28 of the first conductivity type is adjacent to the hybrid doped region 17. A doping concentration of the fourth doped region 28 is higher than that of the first doped region 12. The heavily doped region 36 of the first conductivity type is located in the fourth doped region 28. A doping concentration of the heavily doped region 36 can be higher than that of the fourth doped region 28 and used for reducing serial resistance and increasing breakdown voltage.

The drain region 20 of the first conductivity type is located in the heavily doped region 36. The drain region 20 is surrounded and completely enclosed by the source region 22. A doping concentration of the drain region 20 is higher than that of the heavily doped region 36. In the present embodiment, a shape of the drain region 20 projected to a surface of the substrate 10 is, for example, at least a U-shape (as shown in FIG. 1A and FIG. 1B). According to another embodiment, the shape of the drain region 20 projected to the surface of the substrate 10 can be composed of two or more U-shapes or other shapes (not illustrated). In the present embodiment, the drain region 20 can include a starting portion 20a, a connecting portion 20b and a bottom portion 20c. In the present embodiment, corners of the starting portion 20a and the bottom portion 20c are illustrated in arc shapes, but the embodiment of the invention is not limited thereto. The starting portion 20a can be a semi-circle, or can also be other arc shapes such as a quarter circle, an one-eighth circle and so on, detailed description thereof are omitted hereinafter. In another embodiment, the starting portion 20a can also be a rectangle.

The second doped region (e.g., a HVNW) 30 of the first conductivity type is located in the substrate 10. The third doped region (e.g., the P-type well region) 32, the heavily doped region 34 and the source region 22 are located in the second doped region 30. The third doped region 32 of the second conductivity type is located in the second doped region 30. The heavily doped region 34 of the first conductivity type is located in the third doped region 32 and used for reducing serial resistance and increasing breakdown voltage.

The gate 16 is located above the substrate 10 between the source region 22 and the drain region 20. More specifically, according to an embodiment, the gate 16 extends from the source region 22 towards the drain region 20 to cover a channel region 19, the substrate 10, the first doped region 12 and a portion of the hybrid doped region 17. According to another embodiment, the gate 16 extending from the source region 22 covers the heavily doped region 34, the third doped region 32, the second doped region 30, the substrate 10, the first doped region 12 and a portion of the hybrid doped region 17 in sequence. The gate 16 can be made of a stacking layer of conductive materials such as metal, undoped polysilicon, doped polysilicon, polysilicide or a combination thereof. According to an embodiment, the gate 16 and the hybrid doped region 17 are spaced apart by an isolation structure (or a drifting isolation structure) 24. By using an architecture in which the gate 16 partially covers the isolation structure 24, a position with largest strength of electric field within the electronic field formed between the drain region 20 and the source region 22 can shift towards below the isolation structure 24 instead of falling below the gate dielectric layer 18, so as to prevent the gate dielectric layer 18 with a thinner thickness being punctured by overpowered electronic field. The isolation structures 24 can be, for example, a local thermal oxidation isolation structure made of an isolation material such as silicon oxide. The gate dielectric layer 18 is located between the gate 16 and the substrate 10. The gate dielectric layer 18 is fabricated by using silicon oxide or any other suitable material, for example.

The source region 22 of the first conductivity type is located in the heavily doped region 34. A doping concentration of the source region 22 is higher than that of the heavily region 34. The source region 22 surrounds the drain region 20 (as shown in FIG. 1A and FIG. 1B). More specifically, the source region 22 is surrounded outside of the hybrid doped region 17. The channel region 19 is provided below the gate 16 between the source region 22 and the drain region 20.

The hybrid doped region 17 is located in the first doped region 12 between the channel region 19 and the drain region 20. In the present embodiment, the hybrid doped region 17 includes a top doped region 15 and a compensation doped region 14.

The top doped region 15 of the second conductivity type is located in the first doped region 12 between the channel region 19 and the drain region 20 and adjacent to the fourth doped region 28. In the present embodiment, the top doped region 15 is a linear doped region having a doping concentration gradient in which a concentration is gradually decreased from a region near the channel region 19 to a region near the drain region 20, or the concentration is gradually decreased from a region near the source region 22 to the region near the drain region 20. In other words, the doping concentration gradient of the top doped region 15 is in linearity. Namely, a depth of the top doped region 15 is gradually decreased from the region near the channel region 19 to the region near the drain region 20, and a bottom profile of the top doped region 15 is approximately in linearity.

The compensation doped region 14 of the first conductivity type is located in the top doped region 15. More specifically, the compensation doped region 14 is located in the top doped region 15 between the channel region 19 and the drain region 20, and the gate 16 covers a portion of the compensation doped region 14 and a portion of the top doped region 15. In the present embodiment, the compensation doped region 14 can be a block-shape region having a uniform doping concentration. Since the top doped region 15 has a dopant with the conductivity type opposite to a dopant of the compensation doped region 14, thus the dopant of the compensation doped region 14 can compensate the dopant of the top doped region 15. After being doped, a surface concentration of the hybrid doped region 17 is substantially uniform from the region near the channel region 19 to the region near the drain region 20. In an embodiment, the dopant of the compensation doped region 14 can completely compensate the dopant of the top doped region 15, and after the portion of the top doped region 15 is compensated by the compensation doped region 14 in the hybrid doped region 17, regions not being compensated (i.e., not overlapped with the compensation doped region 14) in the top doped region 15 can still be of the second conductivity type, and includes a doping concentration gradient in which a concentration is gradually decreased from the region near the channel region 19 to the region near the drain region 20. In the present embodiment, before being compensated by the compensation doped region 14, the top doped region 15 also has the doping concentration gradient in which the concentration is gradually decreased from the region near the channel region 19 to the region near the drain region 20.

In an exemplary embodiment, the compensation doped region 14 includes the dopant being, for example, phosphorous or arsenic, the doping concentration being, for example, $1.0 \times 10^{16}$ to $1.0 \times 10^{17}/cm^3$ with the depth being 0.1 to 0.5 μm; the top doped region 15 includes the dopant being, for example, boron or boron difluoride, the doping concentration at a region predetermined for forming the channel region 19 being $1.0 \times 10^{16}$ to $2.5 \times 10^{17}/cm^3$ with the depth being 1.5 to 3.5 μm, and the doping concentration at the region near the drain region 20 being $8 \times 10^{15}$ to $2.0 \times 10^{17}/cm^3$ with the depth being 0.6 to 2.2 μm.

Referring to FIG. 1B, based on a position relation with the drain region 20, the compensation doped region 14 can include at least three regions. According to an embodiment, shapes of the drain region 20 and the source region 22 projected to a surface of the substrate 10 are at least a U-shape; the compensation doped region 14 surrounds a region surrounded by the U-shape of the drain region 20 and extended to a periphery of the U-shape. As shown in FIG. 1B, in an embodiment, the compensation doped region 14 can include at least four regions, namely, a top turning region 14a, a rectangle region 14b, a bottom internal turning region 14c and a bottom external turning region 14d. The top turning region 14a surrounds the starting portion 20a of the drain region 20. The rectangle region 14b is located around the connecting portion 20b of the drain region 20. The bottom internal turning region 14c is located in a region surrounded by the bottom portion 20c of the drain region 20. The bottom external turning region 14d is located outside of a region surrounded by the bottom portion 20c of the drain region 20. Each of the regions (14a, 14b, 14c and 14d) in the compensation doped region 14 has a concentration. The concentrations of the regions (14a, 14b, 14c and 14d) in the compensation doped region 14 can be identical or different to each other. Similarly, the top doped region 15 can include at least four regions each respectively corresponding to one of the top turning region 14a, the rectangle region 14b, the bottom internal turning region 14c and the bottom external turning region 14d. Each of the regions in the top doped region 15 respectively includes a doping concentration gradient, and a concentration and a depth of each region are gradually decreased from the region near the channel region 19 to the region near the drain region 20. The bottom profile of the top doped region 15 is approximately in linearity. In addition, the doping concentration gradients of the regions in the top doped region 15 can be different from each other.

Moreover, the third doped region 32 of the metal oxide semiconductor field effect transistor 100a can further include a sixth doped region 42 of the second conductivity type served as an interface for the substrate 10. Furthermore, the substrate 10 can further include a seventh doped region 44 and an eighth doped region 46 (the seventh doped region 44 and the eighth doped region 46 are omitted in FIGS. 1A, 1B, 2A and 2B). The seventh doped region 44 of the second conductivity type is located around the second doped region 30. The eighth doped region 46 of the second conductivity type is located in the seventh doped region 44.

Referring to FIG. 1A, FIG. 1B and FIG. 1C, the hybrid doped region 17 of the metal oxide semiconductor field effect transistor 100a according to first embodiment of the invention includes the compensation doped region 14 and the top doped region 15. The compensation doped region 14 has the conductivity type identical to the conductivity types of the source region 22 and the drain region 20. The compensation doped region 14 is located in the top doped region 15, and has a concentration being substantially uniform from the region near the channel region 19 to the region near the drain region 20. The conductivity type of the top doped region 15 is different from the conductivity types of the source region 22 and the drain region 20, and the top doped region 15 is located in the first doped region 12. Each of the regions in the top doped region 15 respectively includes a doping concentration gradient in which a concentration is gradually decreased from the region near the channel region 19 to the region near the drain region 20. In addition, a profile depth of the top doped region 15 is smoothly, linearly and gradually decreased from the region near the channel region 19 to the region near the drain region 20.

Referring to FIG. 1C, in the metal oxide semiconductor field effect transistor 100a according to first embodiment of the invention, when the gate 16 is applied with an appropriate bias voltage, an inversion layer (the channel region) can be formed by surface channels on the third doped region 32 below the gate 16, so that and two current paths (i.e., a current path I and a current path II) can also be formed. More specifically, for the current path I, electron can flow from the source region 22, the heavily doped region 34, the channel region 19, the second doped region 30, the substrate 10 (e.g., the epitaxial layer 10b in the substrate 10 in the present embodiment), and the first doped region 12 into the compensation doped region 14 in sequence. Electron flowed into the compensation doped region 14 then flows passing the fourth doped region 28 and the heavily doped region 36 into the drain region 20, thereby forming the current path I, in which a path of electron is different from a path of current. In other embodiments, in case the epitaxial layer 10b is not provided, a distance between the first doped region 12 and the second doped region 30 can be designed to be really short (not illustrated) or even be joint together at a place closing to the surface. Also, since the semiconductor substrate 10a is doped with the concentration being lower, after being flowed to the second doped region 30, electron can flow along the surface below the gate into the first doped region 12 and then flowed into the compensation doped region 14. Electron flowed into the compensation doped region 14 then flows passing the fourth doped region 28 and the heavily doped region 36 into the drain region 20. For the current path II, electron flows from the source region 22, the heavily doped region 34, the channel region 19, the second doped region 30, the substrate 10 (e.g., the epitaxial layer 10b in the substrate 10 in the present embodiment) into the first doped region 12. Next, after being flowed into the fourth doped region 28 along a profile of the top doped region 15 in the first doped region 12, electron flows passing the heavily doped region 36 into the drain region 20, thereby forming the current path II. Accordingly, the on-state resistance can be reduced since the two current paths can be formed when operating the metal oxide semiconductor field effect transistor 100a according to first embodiment of the invention. Moreover, in the metal oxide semiconductor field effect transistor 100a according to first embodiment of the invention, three reduced surface field (RESURF) structures can be formed. In view of FIG. 1C, said three RESURF structures includes an interface of the compensation doped region 14 and the top doped region 15, an interface of the top doped region 15 and the first doped region 12, and an interface of the epitaxial layer 10b and the semiconductor substrate 10a. In other embodiment, the three RESURF structures can be the interface of the compensation doped region 14 and the top doped region 15, the interface of the top doped region 15 and the first doped region 12, and an interface of the first doped region 12 and the semiconductor substrate 10a. In addition, the depth of the compensation doped region 14 is quite shallow to induce a full depletion when operating the elements, such that the breakdown voltage is not significantly reduced. Further, each region of the top doped region 15 being smoothly, linearly and gradually decreased from the region near the channel region 19 to the region near the drain region 20 can adjust an electric field distribution therein, so as to increase the breakdown voltage. Accordingly, the metal oxide semiconductor field effect transistor 100a according to first embodiment of the invention can utilize the hybrid doped region 17 to reduce the on-state resistance so as to improve a consistency of the breakdown voltage.

Figure 1D:
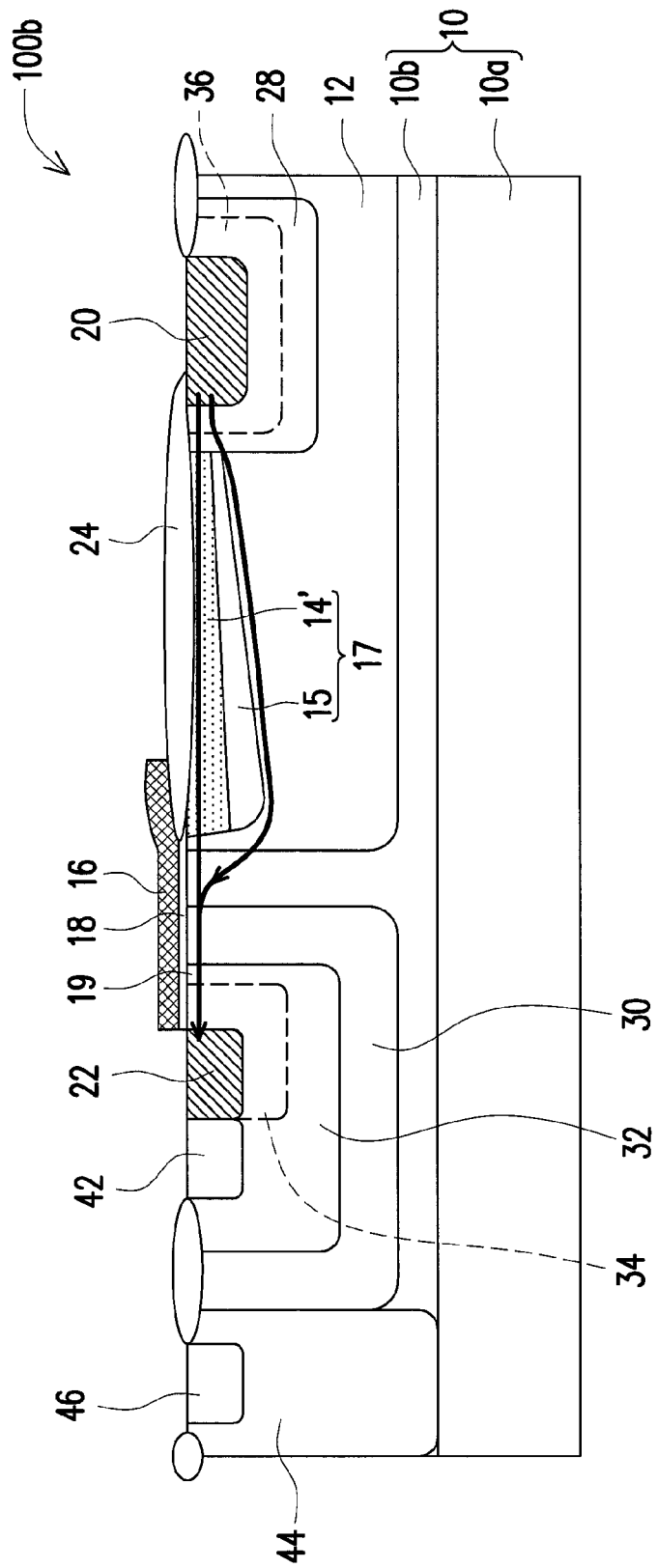
FIG. 1D is a cross-sectional view of the metal oxide semiconductor field effect transistor depicted in FIG. 1A along line I-I according to another exemplary embodiment.

FIG. 1D is a cross-sectional view of the metal oxide semiconductor field effect transistor depicted in FIG. 1A or FIG. 1B along line I-I according to another exemplary embodiment.

The bottom portion of the compensation doped region 14 depicted in FIG. 1C is substantially parallel to the surface of the substrate 10. However, the embodiment of the invention is not limited thereto. In another embodiment, referring to FIG. 1D, a compensation doped region 14' of a metal oxide semiconductor field effect transistor 100b of the present embodiment can be a linear doped region, and a doping concentration gradient of the linear doped region is in linearity. A depth of the compensation doped region 14' is gradually decreased from the region near the channel region 19 to the region near the drain region 20, and a bottom profile of the compensation doped region 14' is approximately in linearity. A dopant of the compensation doped region 14' can compensate the dopant of the top doped region 15, and after the top doped region 15 in the hybrid doped region 17 is compensated, the doping concentration of the top doped region 15 can be gradually decreased from the region near the channel region 19 to the region near the drain region 20. In the present embodiment, before being compensated by the compensation doped region 14', the doping concentration of the top doped region 15 is also gradually decreased from the region near the channel region 19 to the region near the drain region 20.

Figure 2A:
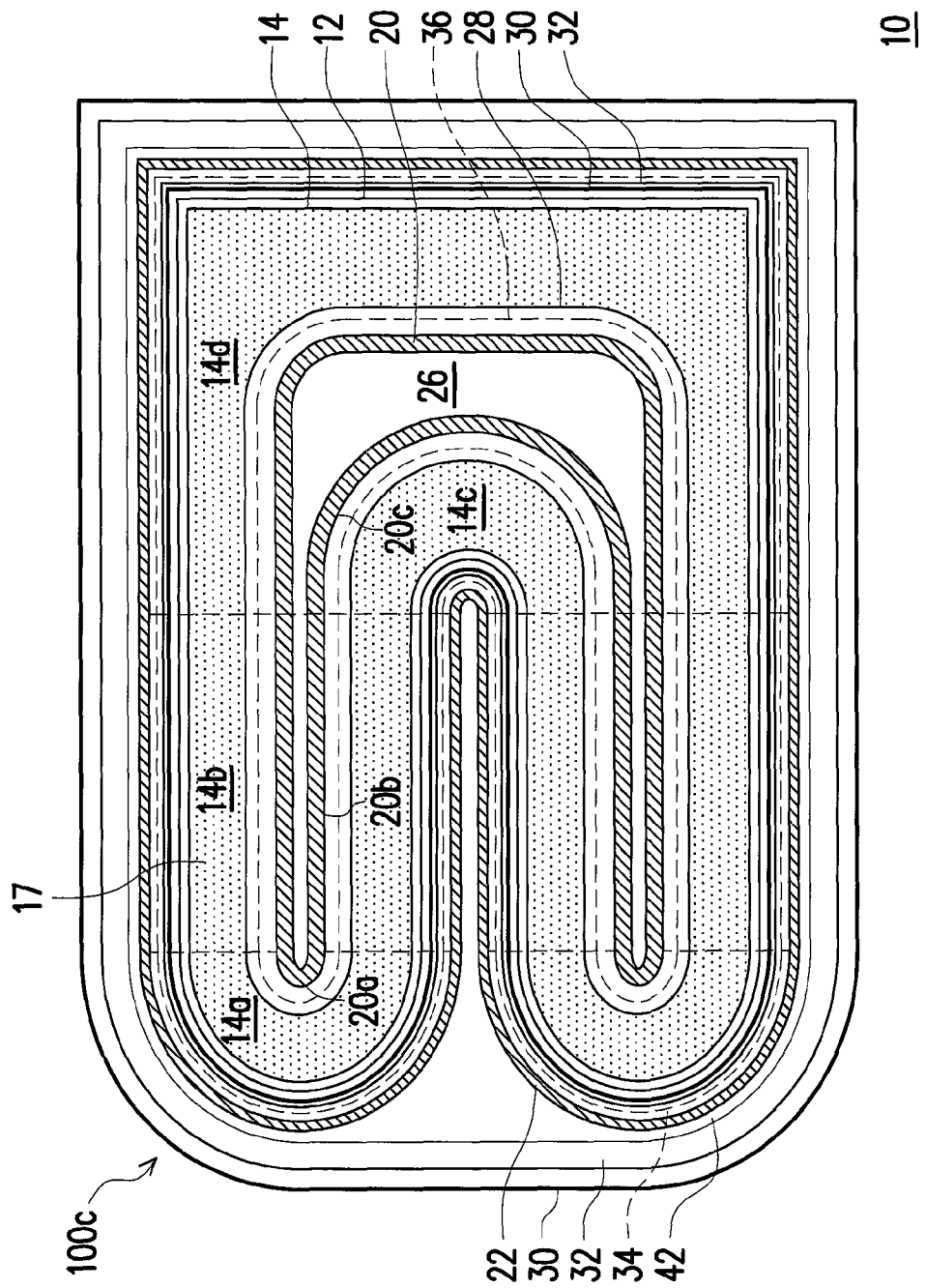
FIG. 2A is a top view illustrating a metal oxide semiconductor field effect transistor according to another embodiment of the invention.
Figure 2B:
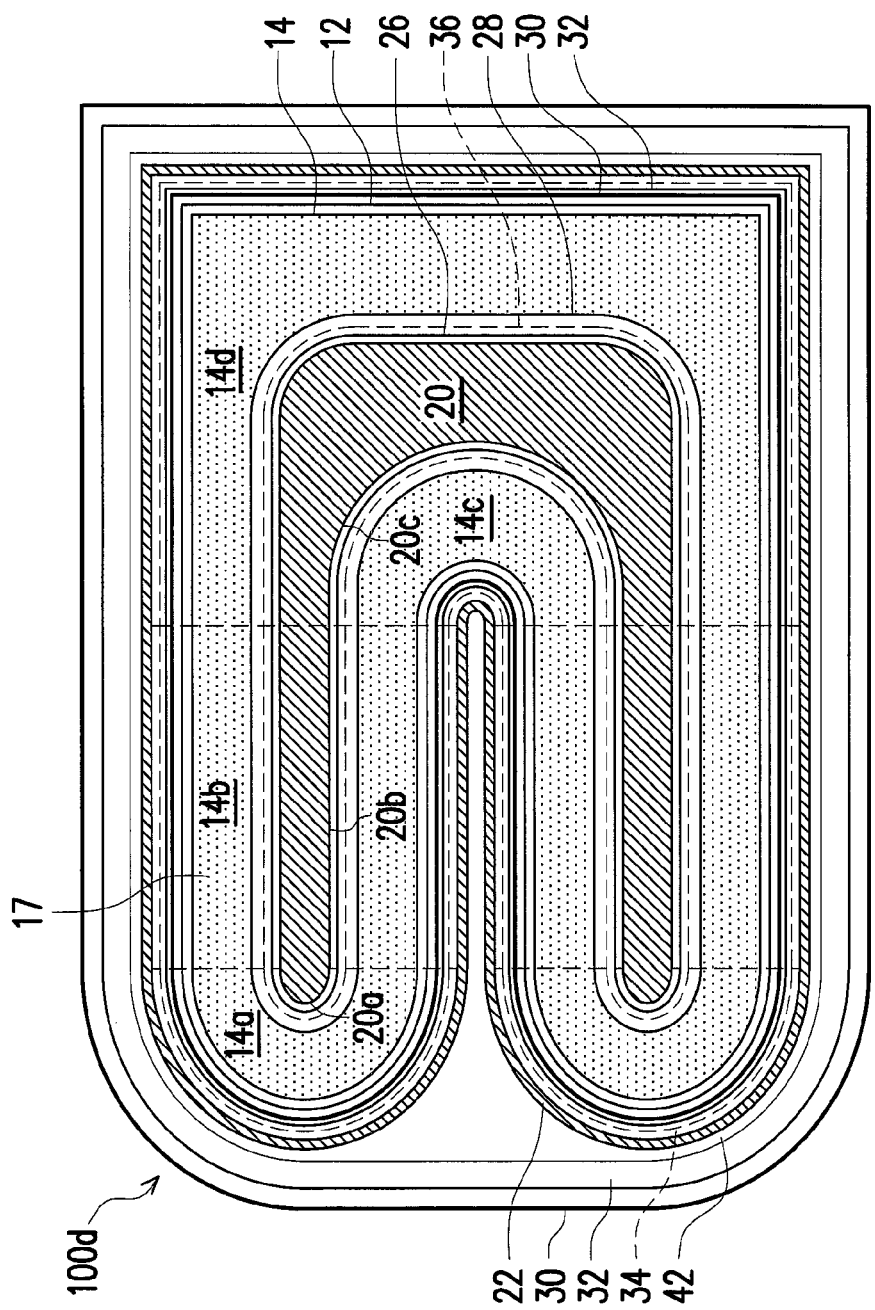
FIG. 2B is a top view illustrating a metal oxide semiconductor field effect transistor according to yet another embodiment of the invention.

FIG. 2A is a partial top view illustrating a metal oxide semiconductor field effect transistor according to another embodiment of the invention. FIG. 2B is a partial top view illustrating a metal oxide semiconductor field effect transistor according to yet another embodiment of the invention.

Referring to FIG. 2A and FIG. 2B, in another embodiment, a metal oxide semiconductor field effect transistor 100c can further include a fifth doped region 26 of the second conductivity type which is adjacent to the drain region 20, and the fifth doped region 26 can be located in a region surrounded by the drain region 20 (as shown in FIG. 2A). Referring to FIG. 2B, in yet another embodiment, a metal oxide semiconductor field effect transistor 100d can include a fifth doped region 26 of the second conductivity type which can be located around the drain region 20 in the heavily doped region 36.

FIGS. 3A to 3E are cross-sectional diagrams illustrating a method of fabricating a metal oxide semiconductor field effect transistor according to first embodiment of the invention.

Figure 3A:
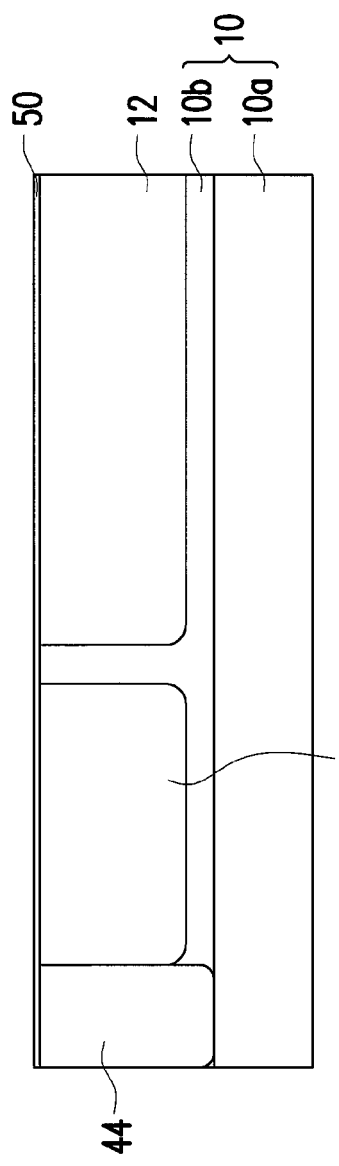
FIGS. 3A through 3E are cross-sectional views of a fabricating process of the metal oxide semiconductor field effect transistor depicted in FIG. 1A along line I-I.

Referring FIG. 3A, the substrate 10 is, for example, the semiconductor substrate 10a, and an epitaxial layer 10b is formed on the semiconductor substrate 10a. The semiconductor substrate 10a can be a P-type substrate, while the epitaxial layer 10b can be a N-type layer (N-epi). The first doped region 12, the second doped region 30 and the seventh doped region 44 are formed in the substrate 10. The first doped region 12, the second doped region 30 and the seventh doped region 44 can be respectively formed by forming an ion implanting mask on the substrate 10 first, and performing an ion implantation process to implant dopant into the epitaxial layer 10b, followed by performing an annealing process. Sequence for forming the first doped region 12, the second doped region 30 and the seventh doped region 44 can be adjusted according to actual demands without any particular limitation. A doping dosage for the first doped region 12 is, for example, $5 \times 10^{11}$ to $2 \times 10^{13}/cm^2$. A doping dosage for the second doped region 30 is, for example, $1 \times 10^{12}$ to $5 \times 10^{13}/cm^2$. A pad oxide layer 50 can be formed on the substrate 10 before performing said ion implantation process. The method of forming the pad oxide layer 50 is, for example, a thermal oxidation process.

Figure 3B:
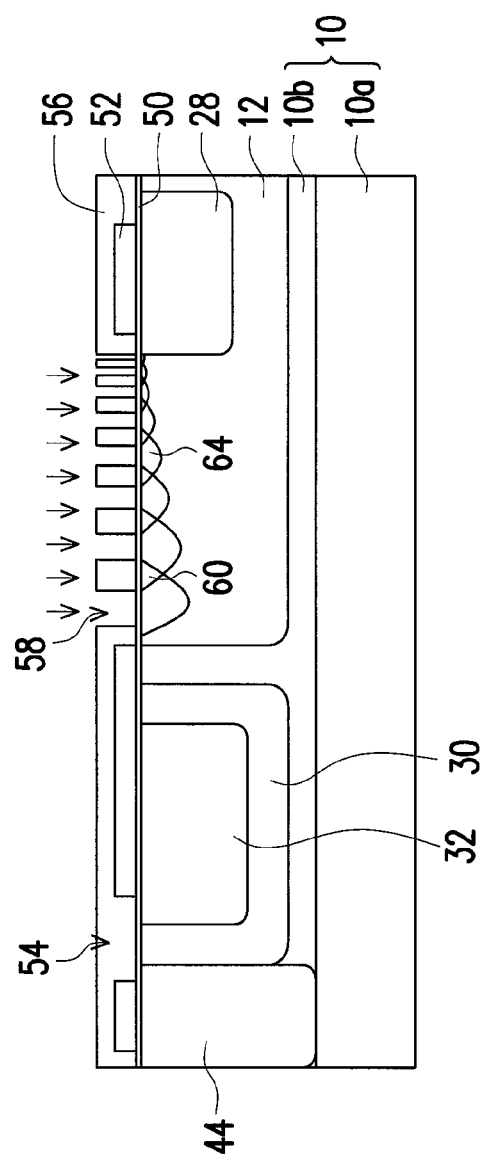

Afterwards, referring to FIG. 3B, the third doped region 32 is formed in the second doped region 30, and the fourth doped region 28 is formed in the first doped region 12. The third doped region 32 and the fourth doped region 28 can also be formed by forming an ion implanting mask, and performing an ion implantation process to implant dopant into the second doped region 30 or the first doped region 12, followed by performing an annealing process. A doping dosage for the third doped region 32 is, for example, $5 \times 10^{12}$ to $1 \times 10^{14}/cm^2$, and a doping dosage for the fourth doped region 28 is, for example, $5.5 \times 10^{12}/cm^2$.

After that, a patterned mask layer 52 is formed on the pad oxide layer 50. The patterned mask layer 52 has a plurality of openings 54. An isolation structure 24 (FIG. 3E) is predetermined to be formed on the substrate 10 below the openings 54. Next, a patterned mask layer 56 is formed on the substrate 10. The patterned mask layer 56 has a plurality of openings 58 on positions corresponding to the top turning region 14a, the rectangle region 14b, the bottom internal turning region 14c and the bottom external turning region 14d depicted in FIG. 1B to expose a portion of the pad oxide layer 50 above the first doped region 12. A dimension of the openings 58 on the positions corresponding to the top turning region 14a, the rectangle region 14b, the bottom internal turning region 14c and the bottom external turning region 14d depicted in FIG. 1B, is gradually decreased from a region predetermined for forming the channel region 19 to a region predetermined for forming the drain region 20 (FIG. 3E, and illustrated as from left to right in FIG. 3B). A pitch between each of the openings 58 (i.e., the patterned mask layer 56) is gradually decreased from the region predetermined for forming the channel region 19 to the region predetermined for forming the drain region 20 (FIG. 3E, and illustrated as from left to right in FIG. 3B). The patterned mask layer 56 can be a hard mask layer or a photoresist layer. A material of the hard mask layer is, for example, silicon nitride. The hard mask layer can be formed by depositing a mask material layer through a chemical vapor deposition and patterning the mask material layer by photolithography and etching processes. When a photoresist material is used for the mask layer, photolithography process can be directly used as the patterning method thereof.

Next, a plurality of doped regions 64 of the second conductivity type can be formed in the first doped region 12 by performing an ion implantation process to implant dopant of the second conductivity type into the first doped region 12 by using the patterned mask layer 56 as an ion implanting mask. The dopant of the second conductivity type used in the ion implantation process can include, for example, ions of boron or boron difluoride. Two adjacent doped regions 64 being formed can be overlapped with each other below the patterned mask layer 56, so as to form an overlapping region 60. A dimension of the overlapping region 60 is related to the pitch (i.e., the patterned mask layer 56) between the two adjacent openings 58.

Figure 3C:
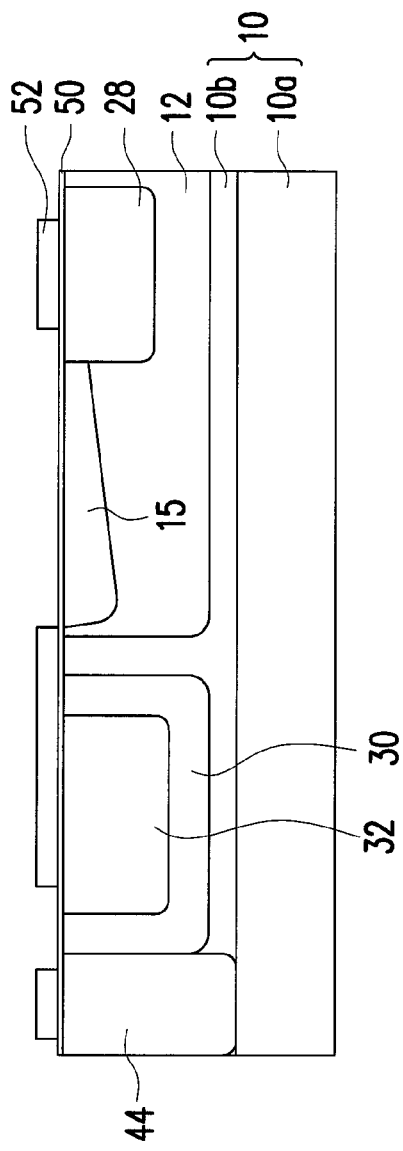

Next, referring to FIG. 3C, the patterned mask layer 56 is removed. Thereafter, the annealing process is performed. A temperature of the annealing process is, for example, ranged from 900° C. to 1150° C. During the annealing process, the overlapping region 60 can be diffused uniformly to collectively form the top doped region 15 of the second conductivity type together with non-overlapping regions. A concentration of the top doped region 15 is gradually decreased from the region predetermined for forming the channel region 19 to the region predetermined for forming the drain region 20 (FIG. 3E, illustrated as from left to right in the figure). According to an embodiment, a doping concentration gradient of the top doped region 15 is in linearity. That is, the doping concentration is gradually decreased in linearity from the region predetermined for forming the channel region 19 to the region predetermined for forming the drain region 20 (FIG. 3E, illustrated as from left to right in the figure). A depth of top doped region 15 is gradually decreased from the region predetermined for forming the channel region 19 to the region predetermined for forming the drain region 20 (FIG. 3E, illustrated as from left to right in the figure), whereas a bottom profile of the top doped region 15 is smooth and approximately in linearity.

By controlling the dimension and the pitch of the openings 58 of the patterned mask layer 56 on the positions corresponding to the top turning region 14a, the rectangle region 14b, the bottom internal turning region 14c and the bottom external turning region 14d depicted in FIG. 1B, different doping concentration gradients can be formed through single photomask and single ion implanting process, such that the fabricating process can be significantly simplified without increasing costs to the fabricating process.

Figure 3D:
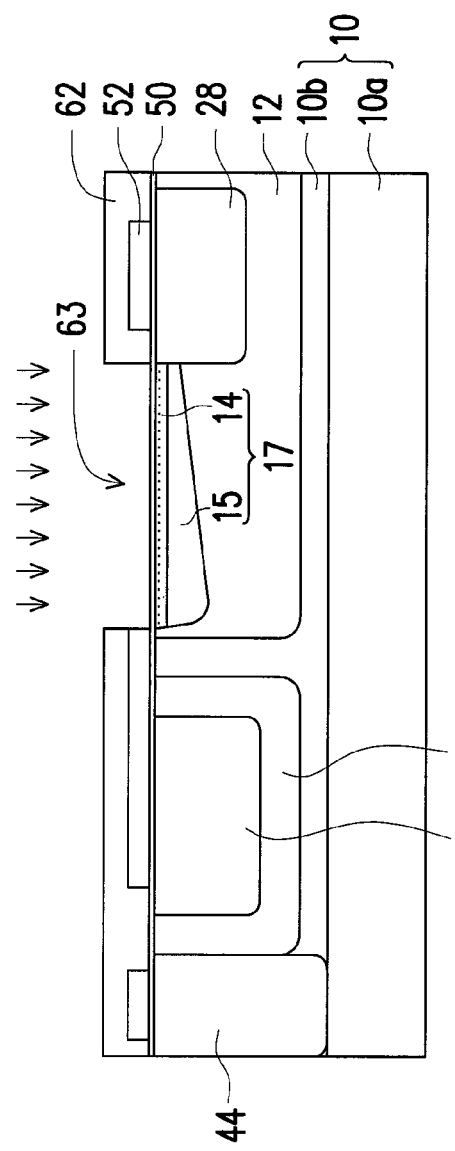
Figure 3E:
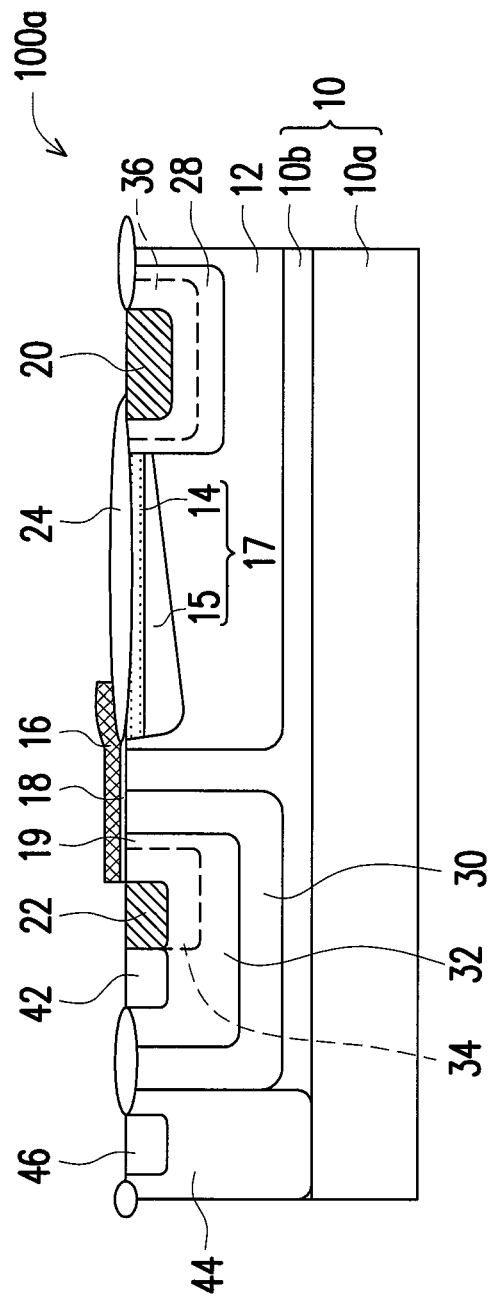

Thereafter, referring to FIG. 3D, a patterned mask layer 62 is formed on the substrate 10. The patterned mask layer 62 covers the patterned mask layer 52. More specifically, the patterned mask layer 62 has an opening 63 exposing the pad oxide layer 50 above the top doped region 15. The patterned mask layer 62 can be a hard mask layer or a photoresist layer. A material of the hard mask layer is, for example, silicon nitride. The hard mask layer can be formed by depositing a mask material layer through a chemical vapor deposition and patterning the mask material layer by photolithography and etching processes. When a photoresist material is used for the mask layer, photolithography process can be directly used as the patterning method thereof.

Next, the compensation doped region 14 can be formed in the top doped region 15 by performing an ion implantation process to implant dopant of the first conductivity type into the first doped region 12 by using the patterned mask layer 62 as an ion implanting mask. The dopant of the first conductivity type used in the ion implantation process can include, for example, arsenic or phosphorous. In an embodiment, the compensation doped region 14 has a uniform concentration and an approximately identical depth from the region predetermined for forming the channel region 19 to the region predetermined for forming the drain region 20. In an embodiment, the compensation doped region 14 below a region predetermined for forming the isolation structure (drifting oxide layer) includes the concentration being, for example, $1.0 \times 10^{16}$ to $1.0 \times 10^{17}/cm^3$ with the depth being, for example, 0.1 to 0.5 μM; the top doped region 15 includes the concentration at the region near the channel region 19 being $1.0 \times 10^{16}$ to $2.5 \times 10^{17}/cm^3$ with the depth being 1.5 to 3.5 μm, and the concentration at the region near the drain region 20 being $8 \times 10^{15}$ to $2.0 \times 10^{17}/cm^3$ with the depth being 0.6 to 2.2 μm. In another embodiment, before the compensation doped region 14 is formed, the top doped region 15 (FIG. 3C) is of the second conductivity type, and has the doping concentration gradually decreased in linearity from the region predetermined for forming the channel region 19 to the region predetermined for forming the drain region 20 (FIG. 3E, illustrated as from left to right in the figure). After the compensation doped region 14 is formed, the regions overlapping with the compensation doped region 14 in the top doped region 15 are completely compensated by the compensation doped region 14 of different conductivity type to become the first conductivity type; and the regions not overlapping with the compensation doped region 14 maintains in the second conductivity type and has the doping concentration gradually decreased in linearity from the region predetermined for forming the channel region 19 to the region predetermined for forming the drain region 20 (FIG. 3E, illustrated as from left to right in the figure).

Thereafter, referring to FIG. 3E, the patterned mask layer 62 is removed, and the isolation structure 24 is formed on the substrate 10. The isolation structure 24 can be formed by using a local thermal oxidation, which forms a local thermal oxide layer in the openings 54 exposed by the patterned mask layer 52. Thereafter, the patterned mask layer 52 and the pad oxide layer 50 (not illustrated in FIG. 3E) are removed. Nevertheless, the forming method of the isolation structure 24 in the embodiment of the invention is not limited to the above.

Afterwards, the heavily doped region 36 is formed in the fourth doped region 28, and the heavily doped region 34 is formed in the third doped region 32. The heavily doped regions 34 and 36 can also be formed by forming an ion implanting mask first, and performing an ion implantation process to respectively implant dopant into the fourth doped region 28 and the third doped region 32, followed by performing an annealing process.

Thereafter, the gate insulating layer 18 and the gate 16 are formed on the substrate 10. The gate dielectric layer 18 can include a single material layer. The single material layer is, for example, a low dielectric constant material or a high dielectric constant material. The low dielectric constant material refers to a constant material having dielectric constant of less than 4, such as silicon oxide or silicon nitride. The high dielectric constant material refers to a constant material having dielectric constant of more than 4, such as HfAlO, $HfO_2$, $Al_2O_3$ or $Si_3N_4$. The gate dielectric layer 18 can have various thickness based on the various constant materials being selected. For example, if the gate dielectric layer 18 is made of silicon oxide, a thickness of the gate dielectric layer 18 can range from 12 nm to 200 nm. The gate 16 is made of a stacking layer of, conductive materials such as metal, undoped polysilicon, doped polysilicon, polysilicide or a combination thereof. The gate dielectric layer 18 and the gate 16 can be forming a gate dielectric material layer and a gate conductor, followed by patterning with lithography and etching process afterwards. Afterwards, the source region 22 and the drain region 20 are respectively formed in the heavily doped regions 34 and 36. According to an embodiment, a doping dosage for the drain region 20 and the source region 22 is, for example, $5 \times 10^{14}$ to $8 \times 10^{15}/cm^2$.

In the foregoing embodiment, before the patterned mask layer 56 for defining the compensation doped region 14 is formed, the patterned mask layer 52 for defining the isolation structure can first be formed on the pad oxide layer 50. However, the embodiment of the invention is not limited thereto. In another embodiment, the patterned mask layer 56 for defining the compensation doped region 14 can first be formed on the pad oxide layer 50, and the patterned mask layer 52 for defining the isolation structure is formed on the pad oxide layer 50 after the compensation doped region 14 is formed and the patterned mask layer 56 is removed.

Further, in another embodiment, the compensation doped region 14 of FIG. 3E can also be replaced by the compensation doped region 14', as shown in FIG. 1D. In the forming method of the compensation doped region 14', the patterned mask layer 62 of FIG. 3D can be changed into the patterned mask layer 56 similar to that depicted in FIG. 3B. That is, the patterned mask layer 62 can be changed to include a plurality of openings (not illustrated) exposing a portion of the oxide layer 50 above the first doped region 12 of each region. A dimension of the openings (not illustrated) of each region is gradually decreased from the region predetermined for forming the channel region 19 to the region predetermined for forming the drain region 20 (from left to right, similar to that in FIG. 3B). A pitch between each of the openings (i.e., the patterned mask layer 62) of each region is gradually decreased from the region predetermined for forming the channel region 19 to the region predetermined for forming the drain region 20 (from left to right, similar to that in FIG. 3B). Subsequently, an ion implantation is utilized to form the compensation doped region 14' having the depth gradually decreased from the source 22 (or the channel region 19) to the drain region 20 and the bottom profile being approximately in linearity.

The linear doped region (i.e., the top doped region) of the invention can be formed by using a single ion implantation process with an alteration of a pattern of a photomask, so that different regions can have different doping concentration gradients. The pattern of the photomask can include multiple regions based on different shapes and positions of the drain region and the source region. Therefore, additional photomasks or additional ions are not required in fabricating of the linear doped region (i.e., the top doped region) of the invention.

Figure 4A:
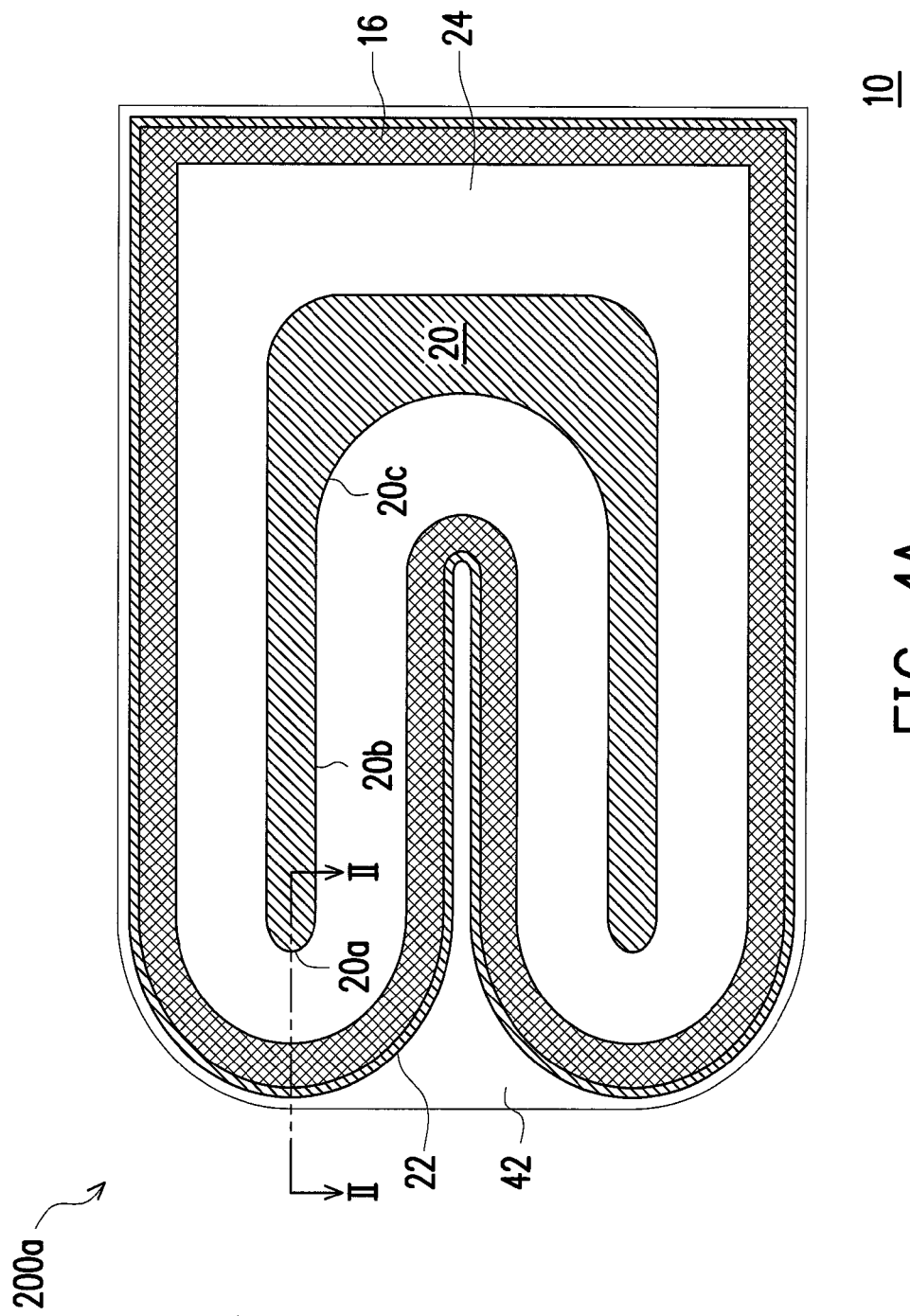
FIG. 4A is a top view illustrating a metal oxide semiconductor field effect transistor according to a second embodiment of the invention.
Figure 4B:
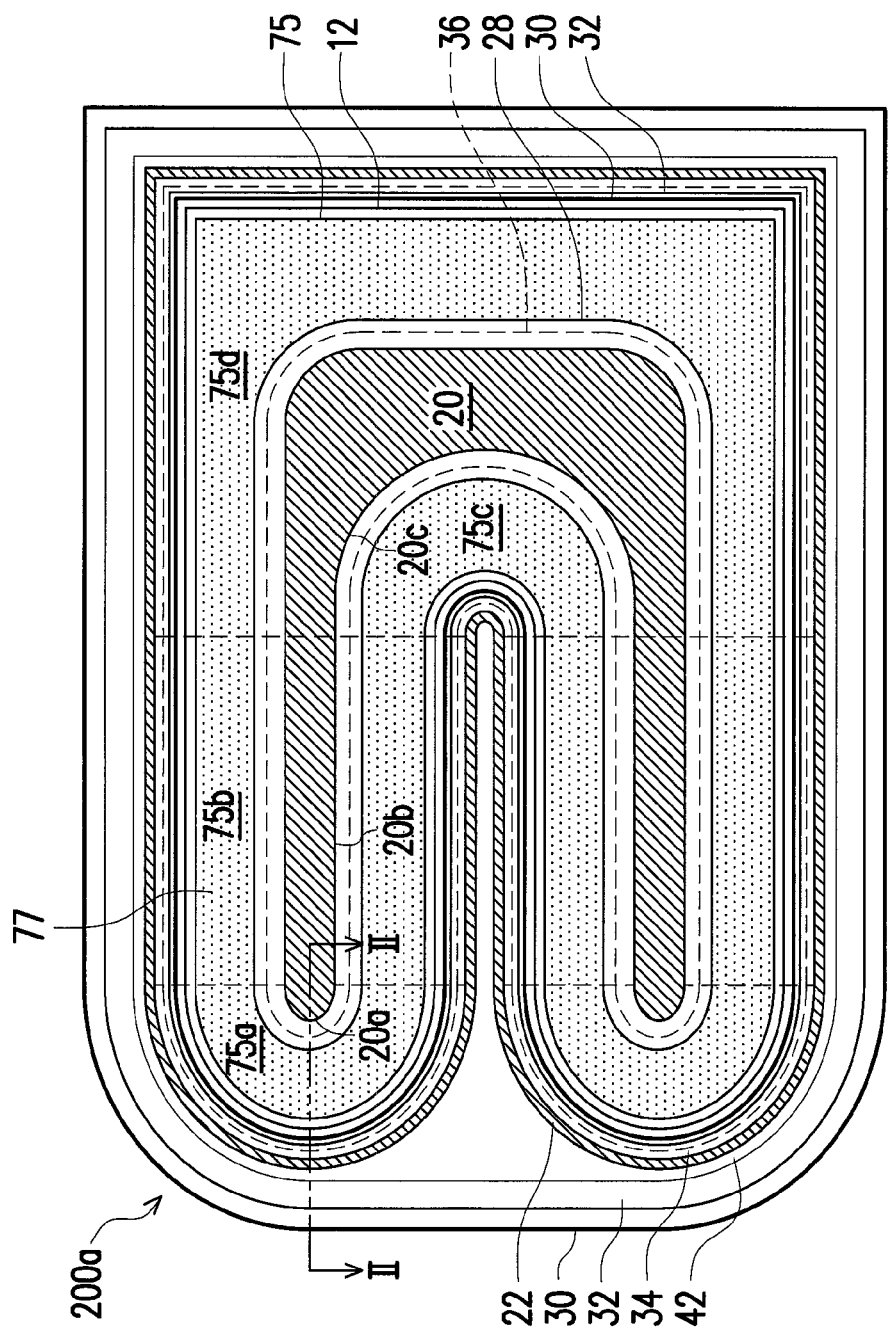
FIG. 4B is a partial top view illustrating the metal oxide semiconductor field effect transistor according to the second embodiment of the invention, in which a gate and an isolation structure are not illustrated.
Figure 4C:
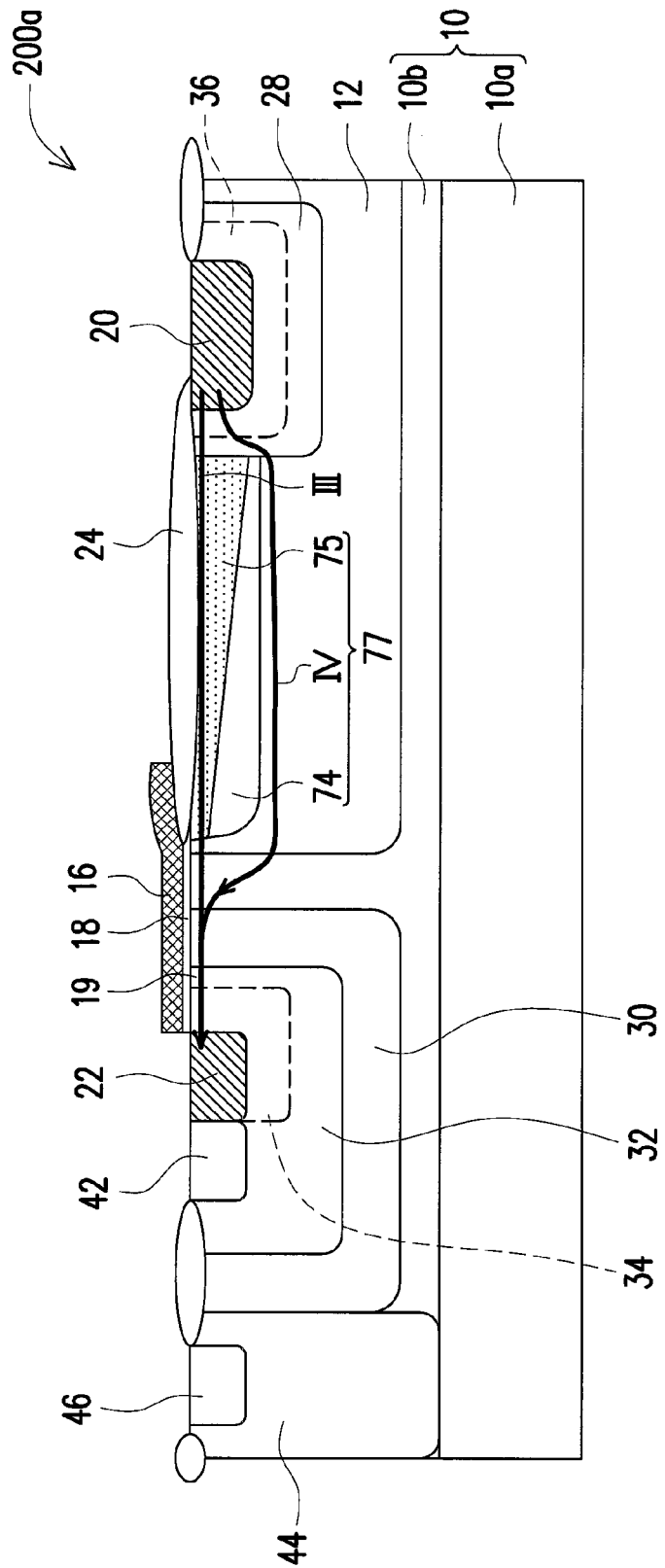
FIG. 4C is a cross-sectional view of the metal oxide semiconductor field effect transistor depicted in FIG. 4A along line II-II according to an exemplary embodiment.
Figure 5A:
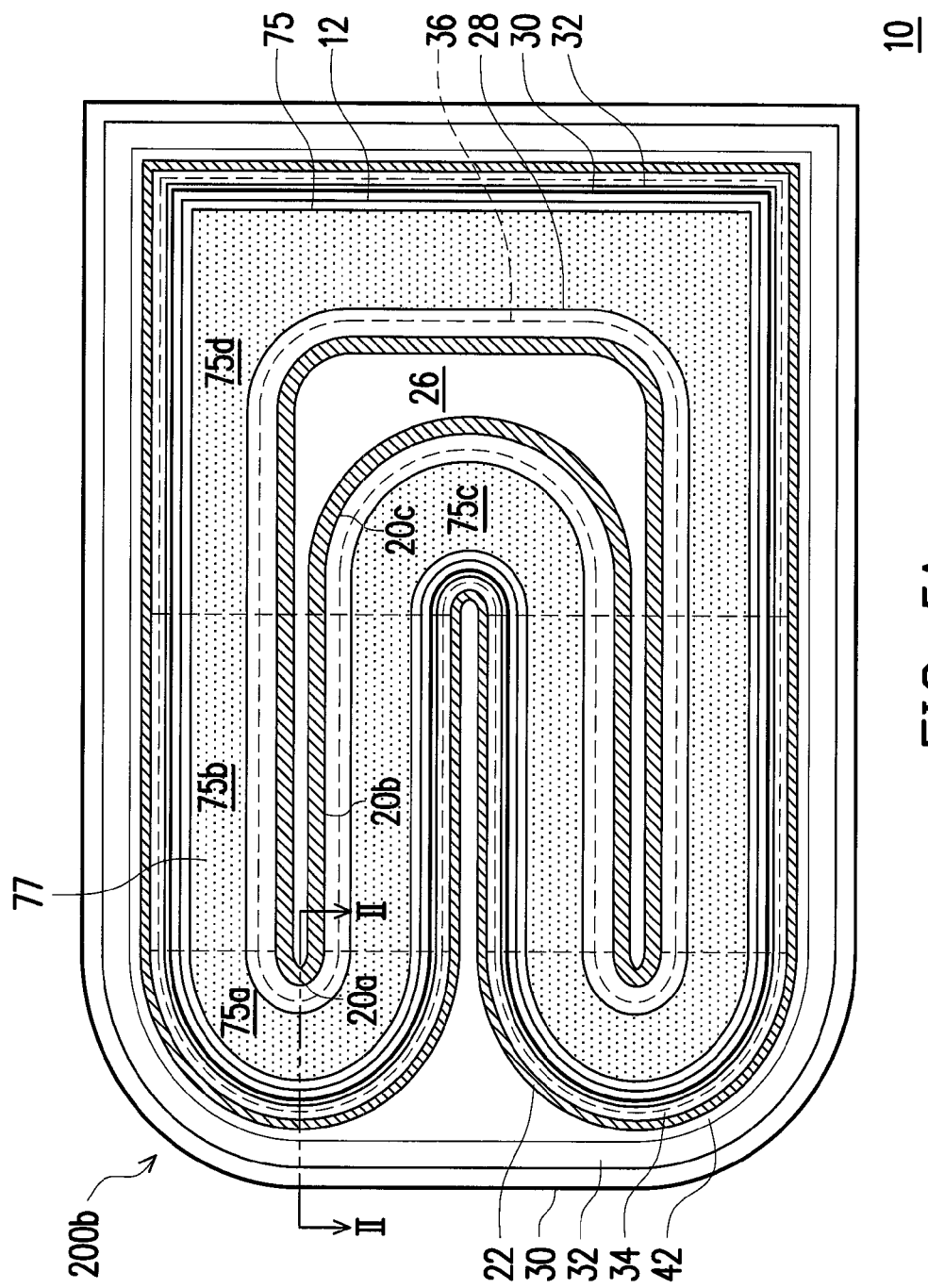
FIG. 5A is a top view illustrating a metal oxide semiconductor field effect transistor according to another embodiment of the invention.
Figure 5B:
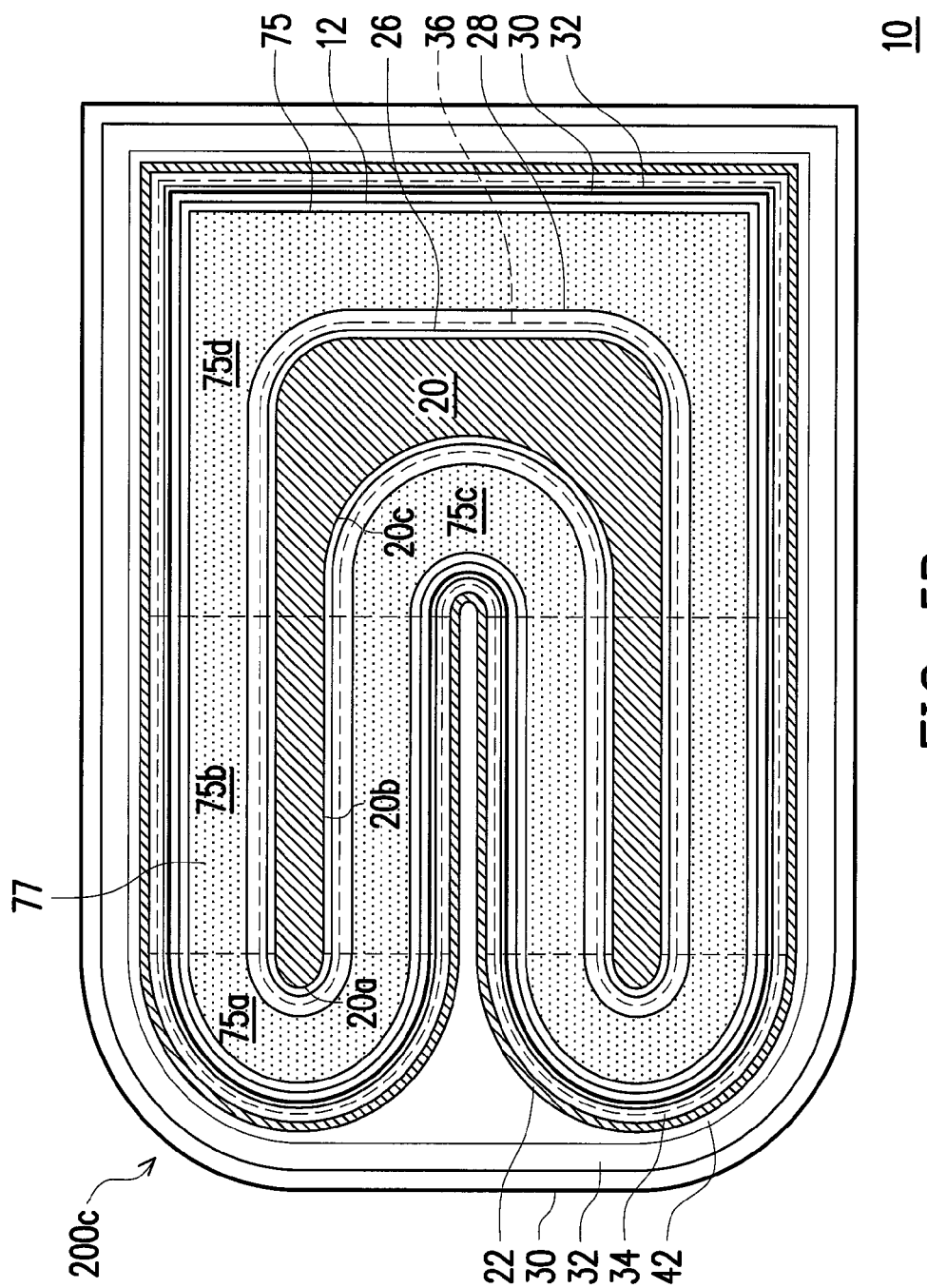
FIG. 5B is a top view illustrating a metal oxide semiconductor field effect transistor according to yet another embodiment of the invention.

FIG. 4A is a top view illustrating a metal oxide semiconductor field effect transistor according to second embodiment of the invention. FIG. 4B is a partial top view illustrating the metal oxide semiconductor field effect transistor according to second embodiment of the invention, in which a gate and an isolation structure are not illustrated. FIG. 4C is a cross-sectional diagram illustrating a metal oxide semiconductor field effect transistor according to second embodiment of the invention. FIG. 5A and FIG. 5B are partial top views illustrating the metal oxide semiconductor field effect transistor according to another embodiment of the invention, in which the gate and the isolation structure are omitted in FIG. 5A and FIG. 5B for clear illustration. FIGS. 6A through 6E are cross-sectional views of a fabricating process of the metal oxide semiconductor field effect transistor depicted in FIG. 4A along line II-II.

Referring to FIG. 4A, FIG. 4B and FIG. 4C, a metal oxide semiconductor field effect transistor 200a according to yet another embodiment of the invention includes a gate 16, a gate dielectric layer 18, a source region 22, a drain region 20 and a hybrid doped region 77. According to another embodiment, the metal oxide semiconductor field effect transistor 200a can further include a first doped region 12, a second doped region 30, a third doped region 32, a fourth doped region 28 and heavily doped regions 34 and 36.

In the present embodiment, the substrate 10, the gate 16, the gate dielectric layer 18, the source region 22, the drain region 20, the first doped region 12, the second doped region 30, the third doped region 32, the fourth doped region 28 and the heavily doped regions 34 and 36 are the same to that described in first embodiment, thus related description is omitted hereinafter. Further, the seventh doped region 44 and the eighth doped region 46 are also omitted in FIGS. 4A, 4B, 5A and 5B.

The hybrid doped region 77 is located in the substrate 10 between the channel region 19 and the drain region 20. In the present embodiment, the hybrid doped region 77 includes a top doped region 74 and a compensation doped region 75.

In the present embodiment, the top doped region 74 can be of the second conductivity type. The top doped region 74 is located in the first doped region 12 between the channel region 19 and the drain region 20, and the gate 16 covers a portion of the top doped region 74 and a portion of the compensation doped region 75.

The compensation doped region 75 can be of the first conductivity type and located in the top doped region 74. In the present embodiment, the compensation doped region 75 can be a linear doped region having a doping concentration gradient. The doping concentration gradient of the compensation doped region 75 is increased in linearity. That is, a depth of the compensation doped region 75 being gradually increased from the region near the channel region 19 to the region near the drain region 20, and a bottom profile of the compensation doped region 75 being approximately in linearity, and a profile depth thereof being smoothly, linearly, gradually increased from the region near the channel region 19 to the region near the drain region 20. In an embodiment, in case the compensation doped region 75 is not provided, the top doped region 74 can be a block-shape region having a uniform concentration. After the compensation doped region 75 is doped, due to the difference in conductivity types, a doping of the compensation doped region 75 can compensate a doping of the top doped region 74. After being compensated, the region (the top doped region) can be of the second conductivity type and has the concentration gradually decreased from the region near the channel region 19 to the region near the drain region 20.

In an embodiment, the top doped region 74 includes the dopant being, for example, boron or boron difluoride, an implanting energy being 80 to 120 KeV and the doping concentration being, for example, $1.5 \times 10^{16}$ to $3 \times 10^{16}/cm^3$; the compensation doped region 75 includes the dopant being, for example, phosphorous or arsenic, an implanting energy being 80 to 120 KeV, the doping concentration at the region near the channel region 19 being $1.3 \times 10^{16}$ to $3.7 \times 10^{16}/cm^3$ with the depth being 0.1 to 0.5 μm, and the doping concentration at the region near the drain region 20 being $3.5 \times 10^{16}$ to $5.0 \times 10^{16}/cm^3$ with the depth being 0.3 to 1.0 μm.

Referring to FIG. 4B and FIG. 4C, in an embodiment, shapes of the drain region 20 and the source region 22 projected to a surface of the substrate 10 are at least a U-shape; the top doped region 74 surrounds a region surrounded by the U-shape of the drain region 20 and extended to a periphery of the U-shape. The compensation doped region 75 is located in the top doped region 74. As shown in FIG. 4B, in an embodiment, the compensation doped region 75 can include at least four regions, namely, a top turning region 75a, a rectangle region 75b, a bottom internal turning region 75c and a bottom external turning region 75d. The top turning region 75a surrounds the starting portion 20a of the drain region 20. The rectangle region 75b is located around the connecting portion 20b of the drain region 20. The bottom internal turning region 75c is located in a region surrounded by the bottom portion 20c of the drain region 20. The bottom external turning region 75d is located outside of a region surrounded by the bottom portion 20c of the drain region 20. Each of the regions (75a, 75b, 75c and 75d) in the compensation doped region 75 respectively includes a doping concentration gradient, and the doping concentration gradients of the regions (75a, 75b, 75c and 75d) are different from each other. The top doped region 74 can include at least four regions each respectively corresponding to one of the top turning region 75a, the rectangle region 75b, the bottom internal turning region 75c and the bottom external turning region 75d. Each of the regions in the top doped region 74 includes a concentration. The concentrations of the regions (respectively corresponding to 75a, 75b, 75c and 75d) in the top doped region 74 can be identical or different to each other.

Referring to FIG. 4C, in the metal oxide semiconductor field effect transistor 200a according to second embodiment of the invention, when the gate 16 is applied with an appropriate bias voltage, an inversion layer (the channel region) can be formed by surface channels on the third doped region 32 below the gate 16, so that two current paths (i.e., a current path III and a current path IV) can also be formed. More specifically, for the current path III, electron can flow from the source region 22, passing the heavily doped region 34, the channel region 19, the second doped region 30, the substrate 10 (e.g, the epitaxial layer 10b in the substrate 10 in the present embodiment), and the first doped region 12 into the compensation doped region 75. Electrons flowed into the compensation doped region 75 then flows passing the fourth doped region 28 and the heavily doped region 36 into the drain region 20, thereby forming the current path III. In the current path III, after being flowed to the substrate 10 (e.g., the epitaxial layer 10b in the substrate 10 in the present embodiment), electron can directly flow into the compensation doped region 75, and then flow passing the fourth doped region 28 and the heavily doped region 36 into the drain region 20. For the current path IV, electron flows passing the heavily doped region 34, the channel region 19, the second doped region 30, the substrate 10 (e.g., the epitaxial layer 10b in the substrate 10 in the present embodiment), and the first doped region 12 into the first doped region 12 below the top doped region 74 from the source region 22. Electron flowed into the first doped region 12 below the top doped region 74 then flows passing the fourth doped region 28 and the heavily doped region 36 into the drain region 20, thereby forming the current path IV. Accordingly, the on-state resistance can be reduced since two channel paths can be formed by the metal oxide semiconductor field effect transistor 200a according to second embodiment of the invention. In addition, the metal oxide semiconductor field effect transistor 200a according to second embodiment of the invention can form three RESURF structures which includes an interface of the compensation region 75 and the top doped region 74, an interface of the top doped region 74 and the first doped region 12, and an interface of the epitaxial layer 10b and the semiconductor substrate 10a. In other embodiment, the three RESURF structures can be the interface of the compensation doped region 75 and the top doped region 74, the interface of the top doped region 74 and the first doped region 12, and an interface of the first doped region 12 and the semiconductor substrate 10a. In addition, the depth of the compensation doped region 75 is quite shallow to induce a full depletion when operating the elements. Further, the doping concentration of the compensation doped region 75 being smoothly, linearly and gradually increased from the region near the channel region 19 to the region near the drain region 20 can adjust an electric field distribution therein, so as to increase the breakdown voltage.

Referring to FIG. 5A, in another embodiment, a metal oxide semiconductor field effect transistor 200b can further include a fifth doped region 26 of the second conductivity type which is adjacent to the drain region 20, and the fifth doped region 26 is located in a region surrounded by the drain region 20 (as shown in FIG. 5A). In yet another embodiment, referring to FIG. 5B, a metal oxide semiconductor field effect transistor 200c can further include a fifth doped region 26 of the second conductivity type which can be located around the drain region 20 in the heavily doped region 36.

FIGS. 6A to 6E are cross-sectional diagrams illustrating a method of fabricating a metal oxide semiconductor field effect transistor according to second embodiment of the invention.

Referring to FIG. 6A, based on the same method used in first embodiment, the first doped region 12, the second doped region 30, the seventh doped region 44 and the pad oxide layer 50 can be formed in the substrate 10.

Referring to FIG. 6B, based on the same method used in first embodiment, the fourth doped region 28 and the third doped region 32 are formed in the first doped region 12 and the second doped region 30, and the patterned mask layer 52 is also formed. Next, a patterned mask layer 82 is formed on the substrate 10. The patterned mask layer 82 covers the patterned mask layer 52. More specifically, the patterned mask layer 82 has an opening 84 exposing a portion of the pad oxide layer 50 above the top doped region 12. The patterned mask layer 82 can be a hard mask layer or a photoresist layer. A material of the hard mask layer is, for example, silicon nitride. The hard mask layer can be formed by depositing a mask material layer through a chemical vapor deposition and patterning the mask material layer by photolithography and etching processes. When a photoresist material is used for the mask layer, photolithography process can be directly used as the patterning method thereof.

Next, the top doped region 74 can be formed by performing an ion implantation process to implant dopant into the first doped region 12 by using the patterned mask layer 82 as an ion implanting mask. The dopant of the second conductivity type used in the ion implantation process can include, for example, ions of boron or boron difluoride. In an embodiment, the top doped region 74 has a uniform concentration and an approximately identical depth from the region predetermined for forming the channel region 19 to the region predetermined for forming the drain region 20 (FIG. 6E).

Figure 6E:
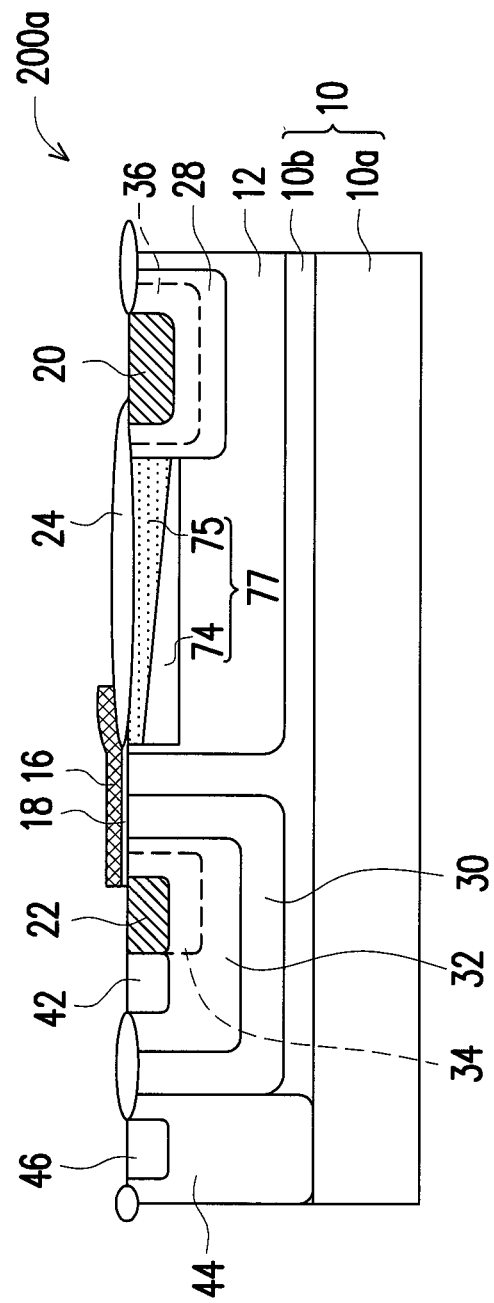

Next, referring to FIG. 6C, the patterned mask layer 82 is removed. Next, a patterned mask layer 86 is formed on the substrate 10. The patterned mask layer 86 has a plurality of openings 88 on positions predetermined for forming the top turning region 75a, the rectangle region 75b, the bottom internal turning region 75c and the bottom external turning region 75d depicted in FIG. 4B to expose a portion of the pad oxide layer 50 above the first doped region 12. A dimension of the openings 88 on the positions corresponding to the top turning region 75a, the rectangle region 75b, the bottom internal turning region 75c and the bottom external turning region 75d depicted in FIG. 4B is gradually increased from the region predetermined for forming the channel region 19 to the region predetermined for forming the drain region 20 (FIG. 6E, and illustrated as from left to right in FIG. 6C). A pitch between each of the openings 88 (i.e., the patterned mask layer 86) is gradually increased from the region predetermined for forming the channel region 19 to the region predetermined for forming the drain region 20 (FIG. 6E, and illustrated as from left to right in FIG. 6C). The patterned mask layer 86 can be a hard mask layer or a photoresist layer. A material of the hard mask layer is, for example, silicon nitride. The hard mask layer can be formed by depositing a mask material layer through a chemical vapor deposition and patterning the mask material layer by photolithography and etching processes. When a photoresist material is used for the mask layer, photolithography process can be directly used as the patterning method thereof.

Next, a plurality of doped regions 90 of the first conductivity type is formed in the top doped region 74 by performing an ion implantation process to implant dopant of the first conductivity type into the top doped region 74 by using the patterned mask layer 86 as an ion implanting mask. The dopant of the first conductivity type used in the ion implantation process can include, for example, arsenic or phosphorous. Two adjacent doped regions 90 being formed can be overlapped with each other below the patterned mask layer 86, so as to form an overlapping region 94. A dimension of the overlapping region 94 is related to the pitch (i.e., the patterned mask layer 86) between the two adjacent openings 88.

Next, referring to FIG. 6D, the patterned mask layer 86 is removed. Thereafter, the annealing process is performed. A temperature of the annealing process is, for example, ranged from 900° C. to 1150° C. During the annealing process, the overlapping regions 94 can be diffused uniformly to collectively form the compensation doped region 75 of the first conductivity type together with non-overlapping regions. A concentration of the compensation doped region 75 is gradually increased from the region predetermined for forming the channel region 19 to the region predetermined for forming the drain region 20 (FIG. 6E, illustrated as from left to right in the figure). According to an embodiment, a doping concentration gradient of the compensation doped region 75 is in linearity. That is, the doping concentration is gradually increased in linearity from the region predetermined for forming the channel region 19 to the region predetermined for forming the drain region 20 (FIG. 6E, illustrated as from left to right in the figure). A depth of compensation doped region 75 is gradually increased from the region predetermined for forming the channel region 19 to the region predetermined for forming the drain region 20 (FIG. 6E, illustrated as from left to right in the figure), whereas a bottom profile of the compensation doped region 75 is smooth and approximately in linearity. The compensation doped region 75 can compensate a portion of the top doped region 74. The hybrid doped region 77 is composed of the compensation doped region 75 and the top doped region 74. The hybrid doped region 77 is located in the substrate 10 (more specifically, in the first doped region 12) between the region predetermined for forming the channel region 19 and the region predetermined for forming the drain region 20. Before the compensation doped region 75 is formed (FIG. 6B), the top doped region 74 in the hybrid doped region 77 is of the second conductivity type, and has a uniform concentration and an approximately identical depth from the region predetermined for forming the channel region 19 to the region predetermined for forming the drain region 20 (FIG. 6E). After the compensation doped region 75 is formed (FIG. 6D), the regions overlapping with the compensation doped region 75 in the top doped region 74 in the hybrid doped region 77 are compensated by the compensation doped region 75 of different conductivity type to become the first conductivity type, and the doping concentration is gradually increased in linearity from the region predetermined for forming the channel region 19 to the region predetermined for forming the drain region 20 (FIG. 6E, illustrated as from left to right in the figure); and the regions not overlapping with the compensation doped region 75 maintains in the second conductivity type and has the concentration gradually decreased from the region near the channel region 19 to the region near the drain region 20 (FIG. 6E).

Furthermore, by adjusting the dimension and the pitch of the openings 88 of the patterned mask layer 86, the top turning region 75a, the rectangle region 75b, the bottom internal turning region 75c and the bottom external turning region 75d with different doping concentration gradients in the top doped region 74 as corresponding that depicted in FIG. 4B can be formed through single photomask and single ion implanting process, such that the fabricating process can be significantly simplified without increasing costs to the fabricating process.

In an embodiment, the top doped region 74 below the region predetermined for forming the isolation structure (or a drifting isolation structure) 24 (FIG. 6E) includes an implanting energy being 80 to 120 KeV and the doping concentration being $1.5\times10^{16}$ to $3\times10^{16}/cm^3$; the compensation doped region 75 includes an implanting energy being 80 to 120 KeV, the doping concentration at the region near the channel region 19 being $1.3\times10^{16}$ to $3.7\times10^{16}/cm^3$ with the depth being 0.1 to 0.5 μm, and the doping concentration at the region near the drain region 20 being $3.5\times10^{16}$ to $5.0\times10^{16}/cm^3$ with the depth being 0.3 to 1.0 μm.

Thereafter, referring to FIG. 6E, based on the same method used in first embodiment, the isolation structure 24 is formed on the substrate 10. Thereafter, the patterned mask layer 52 and the pad oxide layer 50 are removed. Afterwards, the heavily doped region 36 is formed in the fourth doped region 28, and the heavily doped region 34 is formed in the third doped region 32. Thereafter, the gate insulating layer 18 and the gate 16 are formed on the substrate 10. Afterwards, the source region 22 and the drain region 20 are respectively formed in the heavily doped regions 34 and 36.

In the foregoing embodiment, before the patterned mask layer 82 for defining the top doped region 74 is formed, the patterned make layer 52 for defining the isolation structure can first be formed on the pad oxide layer 50. However, the embodiment of the invention is not limited thereto. In another embodiment, the patterned mask layer 82 for defining the top doped region 74 can first be formed on the pad oxide layer 50, and the patterned mask layer 52 for defining the isolation structure can then be formed on the pad oxide layer 50 after the top doped region 74 is formed and the patterned mask layer 82 is removed.

The linear doped region (i.e., the compensation doped region 75) of the embodiment of the invention is formed by using a single ion implantation process with an alteration of a pattern of a photomask, so that different regions can have different doping concentration gradients. The pattern of the photomask can include multiple regions based on different shapes and positions of the drain region and the source region. Therefore, additional photomasks or additional ions are not required to fabricate the linear doped region (i.e., the compensation doped region 75) of the embodiment of the invention.

Breakdown voltage values at different regions in both a metal oxide semiconductor field effect transistor with the compensation doped region according to first embodiment of the invention, and the metal oxide semiconductor field effect transistor with the top doped region but without the compensation doped region are simulated according to a method disclosed by Technology Computer Aided Design (TCAD, in which the TCAD being used is a product provided by Synopsys Technology), and a result thereof is as shown in Table 1. The method disclosed by TCAD is incorporated herein for reference. In conditions adopted in simulation, the top doped region of the hybrid doped region includes a dopant being boron, a dosage of the ion implantation being $1.0 \times 10^{13}$ to $1.8 \times 10^{13}/cm^2$, and an energy being 350 to 400 KeV. The compensation doped region includes a dopant being arsenic, a dosage of the ion implantation being $1.8 \times 10^{12}$ to $2.2 \times 10^{12}/cm^2$, and an energy being 130 to 150 KeV.

TABLE 1

|  | Without compensation doped region (V) | With compensation doped region (V) |
| --- | --- | --- |
| Center region of source | 860 | 859 |
| Center region of drain | 852 | 843 |
| Rectangle region (flat region) between source and drain | 913 | 847 |

In view of Table 1, in comparison to the metal oxide semiconductor field effect transistor without the compensation doped region, in the metal oxide semiconductor field effect transistor with the compensation doped region of the embodiment of the invention, the breakdown voltages in all of the source terminal, the drain terminal and the rectangle region (the flat region) between the source and the drain are very close. This indicates that, besides the problem of current accumulation at drain and source terminals can be solved by using the metal oxide semiconductor field effect transistor with the compensation doped region of the embodiment of the invention, a uniform breakdown voltage can also be provided.

Table 2 lists on-state resistances and threshold voltages in both the metal oxide semiconductor field effect transistor with the compensation doped region according to first embodiment of the invention, and the metal oxide semiconductor field effect transistor without the compensation doped region, which are simulated according to the method disclosed by TCAD.

TABLE 2

|  | Without compensation doped region | With compensation doped region |
| --- | --- | --- |
| On-state resistance Ron (mΩ-cm²) | 332.4 | 268.36 |
| Threshold voltage $V_{th}$ (V) | 3.52 | 3.56 |

In view of Table 2, in comparison to the metal oxide semiconductor field effect transistor without the compensation doped region, in the metal oxide semiconductor field effect transistor of the embodiment of the invention, the on-state resistance Ron of the metal oxide semiconductor field effect transistor with the compensation doped region in the embodiment of the invention is significantly reduced while the threshold voltage remains substantially the same.

Table 3 lists breakdown voltage values at different regions in a metal oxide semiconductor field effect transistor with the compensation doped region according second embodiment of the invention, which are simulated according to the method disclosed by TCAD. The top doped region includes a dopant being boron, a dosage of the ion implantation at the region near the channel region 19 being $5.0 \times 10^{12}$ to $6.0 \times 10^{12}/cm^2$, a dosage of the ion implantation at the region near the drain region 20 being $3.5 \times 10^{12}$ to $4.5 \times 10^{12}/cm^2$ and an energy being 80 to 120 KeV. The compensation doped region includes a dopant being phosphorus, a dosage of the ion implantation at the region near the channel region 19 being $2.6 \times 10^{11}$ to $7.4 \times 10^{11}/cm^2$, a dosage of the ion implantation at the region near the drain region 20 being $1.8 \times 10^{12}$ to $2.5 \times 10^{12}/cm^2$ and an energy being 80 to 120 KeV.

TABLE 3

| Regions | Breakdown voltage (V) |
| --- | --- |
| Rectangle region (flat region) between source and drain | 902 |
| Center region of source | 886 |
| Center region of drain | 777 |

In view of Table 3, it indicates that the breakdown voltage of the flat region or the center region of the source in second embodiment is close to the breakdown voltage in first embodiment, such that demands in high voltage operations are met.

In summary, the problem of current accumulation at drain and source terminals can be solved by using the metal oxide semiconductor field effect transistor with the compensation doped region of the embodiment of the invention, so that a uniform breakdown voltage can also be provided to each region of elements to reduce the on-state resistance of the elements. Furthermore, the linear doped region with the concentration gradient (e.g., the top doped region of first embodiment and the compensation doped region of second embodiment) can be formed through single photomask and single ion implanting process by adjusting the dimension and the pitch of the openings of the patterned mask layer. Therefore, a fabricating process thereof can be greatly simplified without increasing costs to the fabricating process.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A semiconductor device, comprising:
 a drain region of a first conductivity type located in a substrate;
 a source region of the first conductivity type, located in the substrate;
 a channel region located in a portion of the substrate between the source region and the drain region;
 a gate covering the channel region and the portion of the substrate; and
 a hybrid doped region located in the substrate between the channel region and the drain region, and the hybrid doped region comprising:
  a top doped region of a second conductivity type, located in the substrate between the channel region and the drain region, and the top doped region having a doping concentration gradually decreased from a region near the channel region to a region near the drain region; and
  a compensation doped region of the first conductivity type, located in the top doped region to compensate the top doped region.

2. The semiconductor device of claim 1, wherein
 the top doped region is a first linear doped region having a concentration gradually decreased from the region near the channel region to the region near the drain region; and
 the compensation doped region is a block-shape region having a uniform doping concentration.

3. The semiconductor device of claim 1, wherein
 the top doped region is a first linear doped region having a concentration gradually decreased from the region near the channel region to the region near the drain region; and
 the compensation doped region is a second linear doped region having a concentration gradually decreased from the region near the channel region to the region near the drain region.

4. The semiconductor device of claim 1, wherein
 the top doped region has the doping concentration gradually decreased from the region near the channel region to the region near the drain region; and
 the compensation doped region is a linear doped region having a concentration gradually increased from the region near the channel region to the region near the drain region.

5. The semiconductor device of claim 1, further comprising:
 a first doped region of the first conductivity type, located in the substrate around the drain region, wherein the hybrid doped region and the drain region are located in the first doped region;
 a second doped region of the first conductivity type, located in the substrate around the source region;
 a third doped region of the second conductivity type, located in the second doped region;
 a fourth doped region of the first conductivity type, located in the first doped region and adjacent to the hybrid doped region; and
 two heavily doped regions of the first conductivity type, respectively located in the fourth doped region and the third doped region, wherein the drain region and the source region are respectively located in the two heavily doped regions.

6. The semiconductor device of claim 1, further comprising a fifth doped region of the second conductivity type, wherein the fifth doped region is adjacent to the drain region.

7. The metal oxide semiconductor transistor according to claim 1, wherein the first conductivity type is an N-type while the second conductivity type is a P-type; and the first conductivity type is a P-type while the second conductivity type is an N-type.

8. The semiconductor device of claim 1, wherein the drain region is surrounded and completely enclosed by the source region.

9. A method of fabricating a semiconductor device, comprising:
 forming a top doped region of a second conductivity type;
 forming a compensation doped region of a first conductivity type, and the compensation doped region being located in the top doped region,
 forming a drain region on a first side of the top doped region, and the drain region being of the first conductivity type; and
 forming a source region on a second side of the top doped region, the source region being of the first conductivity type, wherein a channel region in a portion of a substrate between the source region and the drain region,
 wherein a doping concentration of the top doped region is gradually decreased from a region near the channel region to a region near the drain region.

10. The method of fabricating the semiconductor device of claim 9, wherein the step of forming the top doped region and the step of forming the compensation doped region, comprising:
 forming a first patterned mask layer, and the first patterned mask layer having at least one first opening;
 performing a first ion implantation process to form the top doped region by using the first patterned mask layer as a mask;
 removing the first patterned mask layer;
 forming a second patterned mask layer, the second patterned mask layer having at least one second opening exposing the top doped region;
 performing a second ion implantation process to form the compensation doped region in the top doped region by using the second patterned mask layer as a mask; and
 removing the second patterned mask layer.

11. The method of fabricating the semiconductor device of claim 10, wherein the first patterned mask layer comprises a plurality of first openings in which a dimension of the first openings being gradually decreased from the region near the channel region to the region near the drain region, and a pitch between the first openings being gradually decreased from the region near the channel region to the region near the drain region.

12. The method of fabricating the semiconductor device of claim 11, further comprising performing an annealing process to smooth a profile of the top doped region.

13. The method of fabricating the semiconductor device of claim 10, wherein the first patterned mask layer has the first opening, and the top doped region formed by the first ion implantation process has a uniform doping concentration.

14. The method of fabricating the semiconductor device of claim 13, wherein the second patterned mask layer comprises a plurality of second openings in which a dimension of the second openings being gradually increased from the region near the channel region to the region near the drain region, and a pitch between the second openings being gradually increased from the region near the channel region to the region near the drain region.

15. The method of fabricating the semiconductor device of claim 14, further comprising performing an annealing process to smooth a profile of the compensation doped region.

16. The method of fabricating the semiconductor device of claim 9, further comprising:
   forming a first doped region of the first conductivity type around the drain region, wherein the top doped region, the compensation doped region and the drain region are located in the first doped region;
   forming a second doped region of the first conductivity type around the source region;
   forming a third doped region of the second conductivity type in the second doped region;
   forming a fourth doped region of the first conductivity type in the first doped region, and the fourth doped region being adjacent to the top doped region and the compensation doped region; and
   forming a heavily doped region of the first conductivity type respectively in the fourth doped region and the third doped region, wherein the drain region and the source region are respectively located in the corresponding heavily doped region.

17. The method of fabricating the semiconductor device of claim 9, wherein the first conductivity type is an N-type while the second conductivity type is a P-type; and the first conductivity type is a P-type while the second conductivity type is an N-type.

18. A metal oxide semiconductor transistor, comprising:
   a drain region of a first conductivity type located in a substrate;
   a source region of the first conductivity type, located in the substrate;
   a gate located above the substrate between the source region and the drain region;
   a gate dielectric layer located between the gate and the substrate; and
   a compensation doped region of the first conductivity type, located in the substrate between the source region and the drain region; and
   a top doped region of a second conductivity type, located below the compensation doped region, and having a doping concentration gradually decreased from a region near the source region to a region near the drain region.

19. A method of fabricating a semiconductor device, comprising:
   forming an N-type doped layer in a substrate;
   forming a top doped region of a P-type in the N-type doped layer between a region predetermined for forming a drain region and a region predetermined for forming a channel region;
   implanting an N-type dopant in the top doped region to form a compensation doped region in the top doped region;
   forming the drain region of an N-type in the N-type doped layer; and
   forming a source region of the N-type conductivity type on a side of the channel region.

20. The method of fabricating the semiconductor device of claim 19, wherein the drain region is surrounded and completely enclosed by the source region.

* * * * *